United States Patent
Dent et al.

(10) Patent No.: US 6,285,251 B1
(45) Date of Patent: Sep. 4, 2001

(54) AMPLIFICATION SYSTEMS AND METHODS USING FIXED AND MODULATED POWER SUPPLY VOLTAGES AND BUCK-BOOST CONTROL

(75) Inventors: Paul Wilkinson Dent, Pittsboro; William O. Camp, Jr., Chapel Hill, both of NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/640,408

(22) Filed: Aug. 17, 2000

Related U.S. Application Data

(63) Continuation-in-part of application No. 09/209,104, filed on Dec. 10, 1998, which is a continuation-in-part of application No. 09/054,063, filed on Apr. 2, 1998, now Pat. No. 6,133,788, and a continuation of application No. 09/054,060, filed on Apr. 2, 1998, now Pat. No. 5,930,128.

(51) Int. Cl.$^7$ .............................. H03G 3/00; H03F 3/68
(52) U.S. Cl. ........................................ 330/127; 330/124 R
(58) Field of Search ............................ 330/124 R, 127, 330/129, 297, 136

(56) References Cited

U.S. PATENT DOCUMENTS

| | | |
|---|---|---|
| 2,210,028 | 8/1940 | Doherty . |
| 3,448,366 | 6/1969 | Goff ........................................ 363/43 |
| 3,777,275 | 12/1973 | Cox ........................................ 330/10 |
| 3,805,139 | 4/1974 | Hoffman, Jr. et al. .................. 321/5 |

(List continued on next page.)

FOREIGN PATENT DOCUMENTS

| | | |
|---|---|---|
| 0 471 346 A1 | 2/1992 | (EP) . |
| 0 598 585 A2 | 5/1994 | (EP) . |
| 0 708 546 A2 | 4/1996 | (EP) . |
| 0 725 478 A1 | 8/1996 | (EP) . |
| 2 267 402 | 12/1993 | (GB) . |
| WO 97/48219 | 12/1997 | (WO) . |
| WO 99/55206 | 10/1999 | (WO) . |

OTHER PUBLICATIONS

U.S. application No. 09/054,063, Dent, filed Apr. 2, 1998.
U.S. application No. 09/209,104, Dent, filed Dec. 10, 1998.
U.S. application No. 09/208,912, Dent et al., filed Dec. 10, 1998.
U.S. application No. 09/216,466, Holden et al., filed Dec. 18, 1998.
U.S. application No. 09/226,478, Camp, Jr. et al., Jan. 7, 1999.
U.S. application No. 09/361,080, Dent, filed Jul. 26, 1999.
U.S. application No. 09/461,671, Dent, filed Dec. 14, 1999.
International Search Report, PCT/US99/26913, Jul. 24, 2000.

(List continued on next page.)

*Primary Examiner*—Robert Pascal
*Assistant Examiner*—Khanh Van Nguyen
(74) *Attorney, Agent, or Firm*—Myers Bigel Sibley & Sajovec

(57) ABSTRACT

A signal of varying amplitude in a first saturated power amplifier that operates from a fixed voltage power supply to produce a first output signal of constant amplitude. The signal of varying amplitude also is amplified in a second saturated power amplifier that operates from a modulated voltage power supply, to produce a second output signal of amplitude that depends on the signal of varying amplitude, a modulated power supply voltage, and on an invert/noninvert control signal. The first and second output signals are combined into a load. The modulated voltage power supply is modulated while generating the invert/noninvert control signal, such that the combined first and second output signals into the load amplify the signal of varying amplitude. The signal of varying amplitude also may be of varying amplitude and varying phase.

58 Claims, 19 Drawing Sheets

U.S. PATENT DOCUMENTS

| | | | |
|---|---|---|---|
| 3,906,401 | 9/1975 | Seidel | 332/18 |
| 3,909,742 | 9/1975 | Cox et al. | 330/84 |
| 3,927,379 | 12/1975 | Cox et a. | 330/10 |
| 4,090,147 | 5/1978 | Seidel | 330/10 |
| 4,178,557 | 12/1979 | Henry | 330/10 |
| 4,315,107 | 2/1982 | Ciesielka et al. | 179/16 F |
| 4,420,723 | 12/1983 | de Jager | 330/10 |
| 4,433,312 | 2/1984 | Kahn | 332/22 |
| 4,485,357 | 11/1984 | Voorman | 332/17 |
| 4,509,017 | 4/1985 | Andren et al. | 329/105 |
| 4,580,111 | 4/1986 | Swanson | 332/41 |
| 4,748,423 * | 5/1988 | Jinich | 330/124 D |
| 4,791,815 | 12/1988 | Yamaguchi et al. | 73/1.37 |
| 4,862,116 | 8/1989 | Olver | 332/23 R |
| 5,077,539 | 12/1991 | Howatt | 330/10 |
| 5,086,450 | 2/1992 | Kitagawa et al. | 379/40 |
| 5,115,203 * | 5/1992 | Krett et al. | 330/207 A |
| 5,365,187 | 11/1994 | Hornak et al. | 330/10 |
| 5,410,280 | 4/1995 | Linguet et al. | 332/149 |
| 5,420,541 | 5/1995 | Upton et al. | 330/286 |
| 5,438,301 | 8/1995 | Havens et al. | 331/45 |
| 5,453,717 | 9/1995 | Gerfault | 330/146 |
| 5,483,433 | 1/1996 | Yang | 363/43 |
| 5,483,681 | 1/1996 | Bergsten et al. | 455/126 |
| 5,559,468 | 9/1996 | Gailus | 330/110 |
| 5,568,088 | 10/1996 | Dent et al. | 330/151 |
| 5,574,967 | 11/1996 | Dent et al. | 455/12.1 |
| 5,612,651 | 3/1997 | Chethik | 332/103 |
| 5,631,604 | 5/1997 | Dent et al. | 330/124 R |
| 5,638,024 | 6/1997 | Dent et al. | 330/84 |
| 5,682,303 | 10/1997 | Goad | 363/71 |
| 5,694,093 | 12/1997 | Da Silva et al. | 332/103 |
| 5,732,333 | 3/1998 | Cox et al. | 455/126 |
| 5,734,565 | 3/1998 | Mueller et al. | 363/132 |
| 5,767,750 | 6/1998 | Yamaji | 332/103 |
| 5,778,029 | 7/1998 | Kaufmann | 375/296 |
| 5,815,531 | 9/1998 | Dent | 375/298 |
| 5,900,778 | 5/1999 | Stonick et al. | 330/149 |
| 5,930,128 | 7/1999 | Dent | 363/43 |
| 5,990,734 | 11/1999 | Wright et al. | 330/2 |
| 5,999,046 * | 12/1999 | Kotzamanis | 330/124 R |
| 6,137,355 * | 10/2000 | Sevic et al. | 330/124 R |
| 6,157,253 * | 12/2000 | Sigmon et al. | 330/124 R |

OTHER PUBLICATIONS

International Search Report, PCT/US99/27008, Feb. 24, 2000.

International Search Report, PCT/US99/24332, Feb. 24, 2000.

Morais et al., NLA–QAM: A Method for Generating High–Power QAM Signals Through Nonlinear Amplification, IEEE Transactions on Communications, vol. Com–30, No. 3, Mar. 1982, pp. 517–522.

International Search Report, PCT/US99/05681, Jul. 6, 1999.

Chireix, *High Power Outphasing Modulation, Proceedings of the Institute of Radio Engineers,* vol. 23, No. 11, Nov. 1935, pp. 1370–1392.

* cited by examiner

AMPLIFICATION SYSTEMS AND METHODS USING FIXED AND MODULATED POWER SUPPLY VOLTAGES AND BUCK-BOOST CONTROL

CROSS REFERENCE TO RELATED APPLICATIONS

This application is a Continuation-in-Part (CIP) of application Ser. No. 09/209,104 to coinventor Dent, entitled Linear Amplification Systems and Methods Using More Than Two Constant Length Vectors, filed Dec. 10, 1998, assigned to the assignee of the present invention, the disclosure of which is hereby incorporated herein by reference, referred to herein as the "CIP Application"; which itself CIP of application Ser. No. 09/054,063, filed Apr. 2, 1998 now Pat. No. 6,133,788, entitled "Hybrid Chireix/Doherty Amplifiers and Methods" to coinventor Dent, assigned to the assignee of the present invention, the disclosure of which is hereby incorporated herein by reference, referred to herein as the "Parent Application" which itself is related to application Ser. No. 09/054,060, filed Apr. 2, 1998 now Pat No. 5,930,128, entitled "Power Waveform Synthesis Using Bilateral Devices" to coinventor Dent, assigned to the assignee of the present invention, the disclosure of which is hereby incorporated herein by reference.

BACKGROUND OF THE INVENTION

This invention relates to power amplifiers and amplifying methods, and more particularly to high-efficiency power amplifiers and related methods Power amplifiers are widely used in communication systems, for example in radiotelephone base stations and radiotelephones. In radiotelephone communication systems, power amplifiers typically amplify high frequency signals for transmission.

A major consideration in the design of power amplifiers is the efficiency thereof. High efficiency is generally desirable so as to reduce the amount of power that is dissipated as heat. Moreover, in many applications, such as in satellites and portable radiotelephones, the amount of power that is available may be limited. An increase in efficiency in the power amplifier therefore may be desirable, in order to allow an increase the operational time or capacity for the satellite or portable radiotelephone.

In U.S. Pat. No. 2,210,028 to Doherty (August 1940), an arrangement of two vacuum tube power amplifiers coupled by a single quarter wave line is described. A semiconductor version of the Doherty amplifier is described in a more recent U.S. Pat. No. 5,420,541 entitled "Microwave Doherty Amplifier", to Upton et al. In Proc. IRE, Vol. 23 No. 11 (1935), pages 1370–1392, entitled "High Power Outphasing Modulation", Chireix describes producing a transmitter giving a modulated amplitude output signal by combining two constant output amplitude amplifiers with a variable phase difference so that their outputs can be varied in relative phase from additive to subtractive. In U.S. Pat. Nos. 5,568,088; 5,574,967; 5,631,604; and 5,638,024 to coinventor Dent, all entitled "Waste Energy Control and Management in Power Amplifiers", various arrangements of coupled power amplifiers are disclosed in which a varying amplitude signal may be produced using constant amplitude power amplifiers. In applicant's 1964 graduate thesis project, an amplifier was built and reported in which the value of Vcc was selected to be either Vcc or 0.7 Vcc based on whether the desired output amplitude was greater or less than 0.7 Vcc. Finally, in the 1960s, many so-called "class-D" or pulse-width modulation amplifiers were proposed and manufactured.

SUMMARY OF THE INVENTION

Embodiments of the present invention can amplify a signal using fixed and modulated power supply voltages, and buck/boost control. In particular, an embodiment of the present invention amplifies a signal of varying amplitude in a first saturated power amplifier that operates from a fixed voltage power supply to produce a first output signal of constant amplitude. The signal of varying amplitude also is amplified in a second saturated power amplifier that operates from a modulated voltage power supply, to produce a second output signal of amplitude that depends on the signal of varying amplitude, a modulated power supply voltage, and on an invert/noninvert control signal. The first and second output signals are combined into a load. The modulated voltage power supply is modulated while generating the invert/noninvert control signal, such that the combined first and second output signals into the load amplify the signal of varying amplitude. The signal of varying amplitude also may be of varying amplitude and varying phase.

DETAILED DESCRIPTION OF PREFERRED EMBODIMENTS

Figure 1:
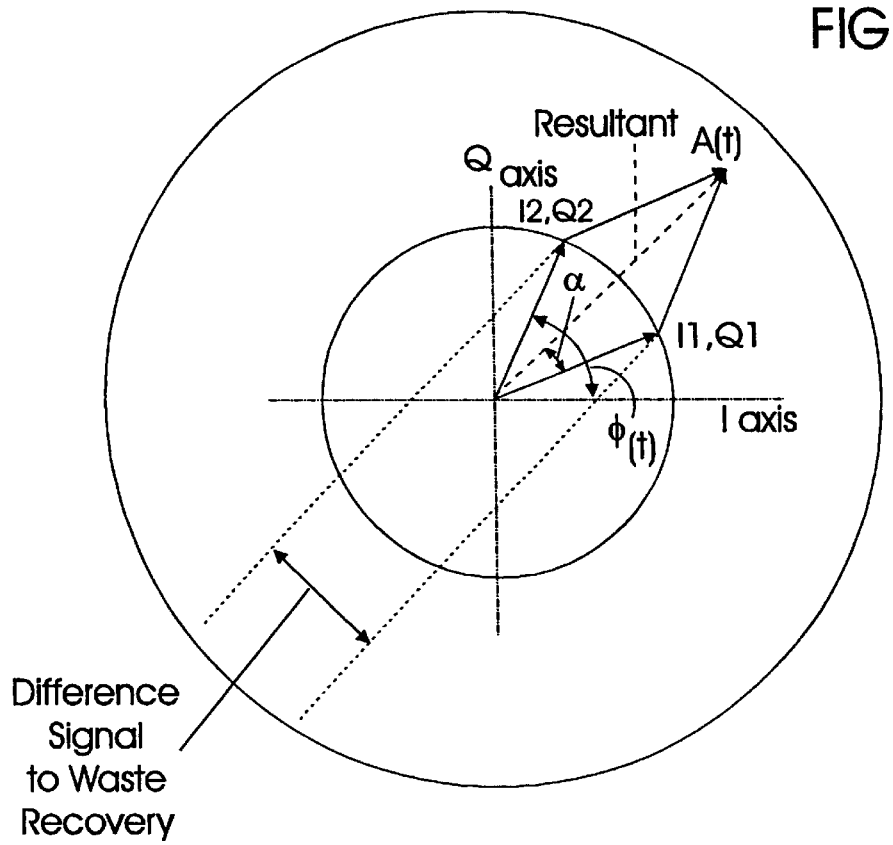
FIG. 1 graphically illustrates vector addition of two constant envelope signals.

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Moreover, each embodiment described and illustrated herein includes its complementary conductivity type embodiment as well.

A conventional power amplifier such as a class-B amplifier generally only provides maximum efficiency at or near to its maximum saturated power output level. In order to accurately reproduce a signal of varying amplitude, the peak output signal level should be equal to or less than that maximum saturated power level. When the instantaneous signal output level is less than the peak, a conventional class-B power amplifier generally operates at less than maximum efficiency.

The efficiency generally reduces as the square root of the output power. This is because, using the class-B example, the output power reduces as the square of the output current but the power consumption from the battery or other DC supply reduces only proportional to the output current. Therefore, the efficiency, which is the ratio of output power to battery power, reduces proportional to the current, i.e., proportional to the square root of the output power.

Accordingly, a power amplifier that has 60% efficiency at a peak output of 2 watts will generally have no more than 42% efficiency at an output of 1 watt (3 dB reduced output). Moreover, when amplifying a signal of varying amplitude, a conventional amplifier may not produce an output signal amplitude proportional to the input signal amplitude, thereby causing nonlinear distortion and intermodulation.

With a varying output signal power $P(t)=A^2(t)$, the average efficiency can be estimated to be:

$$\text{Max efficiency} \times \frac{\text{average of } (P(t)/P\text{max})}{\text{average of square root } (P(t)/P\text{max})}$$

or $$\text{Max efficiency} \times \frac{\text{average of } (A(t)/A\text{max})^2}{\text{average of } (A(t)/A\text{max})}.$$

Nonlinearities in conventional amplifiers can be reduced by various techniques, such as by an inverse predistortion of the input signal, or by feedback including Cartesian feedback in radio frequency power amplifiers for linearly amplifying signals with a bandwidth much less than the center frequency. Unfortunately, linearization generally does not alter the above efficiency formula, which in fact already assumes that the output amplitude can be made to faithfully follow the desired varying amplitude waveform. In effect, the average efficiency calculated above already assumes perfect linearization.

The loss of efficiency comes about because current I(t) is drawn from the battery at a constant voltage Vcc, but is supplied to the load at a varying voltage I(t)·RL which is less than Vcc. The voltage difference Vcc−I(t)·RL is lost across the output device (e.g. collector junction), causing power dissipation in the device.

In U.S. Pat. No. 2,210,028 to Doherty (August 1940), an arrangement of two vacuum tube power amplifiers coupled by a single quarter-wave line is described. The first amplifier is operated up to an output level of Pmax/4, at which it achieves maximum practical class-B efficiency. For powers above this level, the second amplifier is caused to contribute. The second amplifier affects the load impedance of the first amplifier one quarter wave away such that the first amplifier can increase its power up to Pmax/2, while the second amplifier also contributes up to Pmax/2, making Pmax in total, at which point both amplifiers are once more achieving maximum practical class-B efficiency. Thus, efficiency is preserved over a 6 dB range of output levels from Pmax/4 to Pmax. A semiconductor version of the Doherty amplifier is described in a more recent U.S. Pat. No. 5,420,541 entitled "Microwave Doherty Amplifier" to Upton et al.

In the prior art Doherty amplifier, the "normal" power amplifier amplifies a signal from 0 power to ¼ the peak power level, achieving maximum class-B efficiency at that power level. The peak power amplifier then begins to contribute to the output power and by reducing the effective load impedance seen by the "normal" power amplifier, enables it to generate a greater power output up to half the peak power level. The peak power amplifier also generates half the peak power level so that the two amplifiers jointly produce the desired peak power level. The "peak" power amplifier in this prior art is not operated in antiphase so as to detract from the output power level, and thereby increasing the effective load impedance seen by the "normal" power amplifier and allowing it to generate less power efficiently. Thus the "peak" power amplifier does not operate symmetrically as a "trough" power amplifier.

In Proc. IRE, Vol. 23 No. 11 (1935), pages 1370–1392, entitled "High Power Outphasing Modulation", Chireix describes producing a transmitter giving a modulated amplitude output signal by combining two constant output amplitude amplifiers with a variable phase difference so that their outputs can be varied in relative phase from additive to subtractive. The Chireix and Doherty techniques were not combined to obtain an amplifier of good linearity and high efficiency, as the Doherty amplifier relied on the two constituent amplifiers being co-phased while the Chireix amplifier relied upon them being out-of-phase. When two amplifiers are out-of-phase, as they were in the prior art, they are preferably isolated from one another using a hybrid coupler or directional coupler to combine them. The directional coupler combines the two amplifier's output signals to produce a sum signal and a difference signal, the sum signal being used as the desired output and the difference signal being terminated in a dummy load. Since all the amplifier power ends up at either the sum or the difference port and is not reflected to either amplifier, the amplifiers are isolated from one another and do not affect each other's load line.

In U.S. Pat. Nos. 5,568,088; 5,574,967; 5,631,604; and 5,638,024 to coinventor Dent, all entitled "Waste Energy Control and Management in Power Amplifiers", various arrangements of coupled power amplifiers are disclosed in which a varying amplitude signal may be produced using constant amplitude power amplifiers. In one arrangement, two constant power amplifiers are driven with a relative phase shift as in Chireix such that their outputs add more or less constructively or destructively to produce a varying output. The amplifiers were coupled at their outputs using a hybrid coupler or directional coupler which forms both a sum signal and a difference signal. An improvement over the prior art described therein comprises recovering the normally wasted energy at the difference port using a rectifier circuit. The Doherty patent, the Chireix paper and the above referenced Dent patents are hereby incorporated by reference herein.

In applicant's 1964 graduate thesis project, an amplifier was built and reported in which the value of Vcc was selected to be either Vcc or 0.7 Vcc based on whether the desired output amplitude was greater or less than 0.7 Vcc. With a pure sine wave drive, this raised the peak efficiency from the theoretical value of $\pi/4$ (~78.5%) for a class-B amplifier to 85.6% for the new amplifier, termed class-BC. The efficiency at half maximum output power was now 78.5% instead of 55% for class-B.

The Vcc selection was effected by using a first pair of transistors connected to the 0.7 Vcc supply to supply load current when the output amplitude was less than 0.7 Vcc, and a second pair of transistors connected to the full Vcc supply for supplying the load current for amplitudes between 0.7 Vcc and Vcc. Diodes were used to protect the first pair of transistors by preventing reverse current flow when the output amplitude was driven above their supply voltage. The above arrangement worked well for audio frequencies where diodes turn on and off sufficiently fast, but may not be effective for microwave frequencies.

Also in the 1960s, many so called "class-D" or pulse-width modulation amplifiers were proposed and manufactured. Pulse-width modulation amplifiers switched the output devices on and off at a high frequency with a mark-space ratio proportional to the instantaneous desired signal waveform. A low-pass output filter smoothed the switching signal to reject the high switching frequency and to produce the mean of the varying mark-space ratio signal as the desired output signal waveform. A disadvantage of the class-D amplifier was the need to switch the output devices at a very much higher frequency than the desired signal to be amplified, which may not be practical when the desired signal is already a high frequency signal such as a microwave signal.

The above survey indicates that many techniques have been used in order to improve the efficiency of power amplifiers. However, notwithstanding these techniques, there continues to be a need for power amplifiers that can operate at high efficiencies at maximum output, and also at outputs that are below maximum output. Moreover, it is desirable for high efficiency power amplifiers to operate with high frequency signals, such as are used in wireless communication systems.

The Parent Application describes the coupling two amplifiers that are driven using Chireix outphasing modulation to one another, so that the amplifiers affect each other's effective load line. The two amplifiers can thereby maintain efficiency over a wider dynamic range than in a conventional Doherty amplifier.

More specifically, the Parent Application provides apparatus that amplifies an AC input signal of varying amplitude and varying phase using a DC power supply. The apparatus includes a converter that converts the AC input signal into a first signal having constant amplitude and a first phase angle and into a second signal having constant amplitude and a second phase angle. A first amplifier amplifies the first signal, and a second amplifier amplifies the second signal. A coupler couples the first and second amplifiers to one another and to a load impedance, such that voltages or currents in the first amplifier become linearly related to voltages or currents in the second amplifier.

In one embodiment, the coupler comprises at least one transformer that serially couples the first and second amplifiers to one another and to the load impedance. In another embodiment, the coupler comprises first and second quarter wave transmission lines that couple the respective first and second amplifiers to one another and to the load impedance.

According to another aspect of the Parent Application, the first and second amplifiers are first and second bilateral amplifiers, such that current flows from the first and second amplifiers to the DC power supply during part of the signal cycle of the AC input signal, to thereby return energy to the DC power supply. Further increases in efficiency may thereby be obtained.

Accordingly, two coupled amplifiers driven using the outphasing modulation of Chireix can operate identically and can symmetrically affect each other's effective load line so as to efficiently generate both peak and trough power levels and maintain efficiency over a wider dynamic range than in a Doherty amplifier. When the two amplifiers that are not in phase affect each other's load line, current flows from the DC source to the load during part of the signal waveform cycle and flows to the source for another part of the cycle. The mean power consumption from the source can be reduced in the same ratio as the load power is reduced, thus maintaining efficiency. In the Chireix and Doherty disclosures, vacuum tubes of that era were not able to conduct in the reverse direction to return current to the source. In contrast, in the Parent Application, two amplifiers constructed using bilateral devices are driven by two, separate, preferably digitally synthesized waveforms and their outputs are combined, for example using transformers or two quarter wave lines connected to a harmonic short circuit. Using the Parent Application, the linearity advantage of Chireix may be obtained together with an even greater efficiency improvement than Doherty's technique.

When two constant amplitude signals are to be combined to produce a varying amplitude, the phase of each signal is varied in the opposite direction to one another. When the phase of the resultant also varied, the desired phase variation is added to the phases of each signal. The direction of phase variation is additive to the varying phase component in the case of one of the signals, and subtractive from the other. Thus, the phase of one signal may need to vary more rapidly.

When a phase locked loop is used to produce the desired varying phases at a desired radio frequency, the loop bandwidth that is needed to follow the more rapidly varying phase therefore may need to be increased. This increase in phase locked loop bandwidth may allow more undesirable noise amplification.

The CIP Application can provide power amplifiers and amplifying methods that need not unduly increase the phase locked loop bandwidth that is used to produce varying phases at a desired high frequency. In particular, according to the CIP Application, an input signal of varying amplitude and varying phase is converted into more than two signals of constant amplitude and controlled phase. Each of the more than two signals of constant amplitude and controlled phase is then separately amplified in separate amplifiers. The separately amplified more than two signals of constant amplitude and controlled phase are then combined to produce an output signal that is an amplification of the input signal at the desired power level. When converting the input signal into more than two signals, the phase of each of the more than two signals of constant amplitude and controlled phase is controlled to produce the output signal that is an amplification of the input signal at the desired power level.

In a preferred embodiment of the CIP Application, the more than two signals of constant amplitude and controlled phase are four signals of constant amplitude and controlled phase. The four signals of constant amplitude and controlled phase preferably are a first pair of signals of constant amplitude and controlled phase that combine to produce a first complex part of the output signal and a second pair of signals of constant amplitude and controlled phase that combine to produce a second complex part of the output signal. The phases of the first pair of signals of constant amplitude and controlled phase preferably are controlled to vary in a counter-rotating manner to produce the first complex part of the output signal. The phases of the second pair of signals of constant amplitude and controlled phase preferably are controlled to vary in a counter-rotating manner to produce the second complex part of the output signal. Saturated power amplifiers are preferably used to separately amplify each of the more than two signals of constant amplitude and controlled phase.

In one embodiment of the CIP Application, combining takes place by series-combining the separately amplified more than two signals of constant amplitude and controlled phase to produce an output signal that is an amplification of the input signal at the desired power level. Series-combining may take place by using more than two transformers each having a primary winding and a secondary winding. A respective primary winding is coupled to a respective one of the more than two amplifiers. The secondary windings are serially coupled to produce an output signal that is an amplification of the input signal at the desired power level. Alternatively, more than two quarter wavelength transmission lines may be used to combine the signals from the more than two amplifiers. Each transmission line has first and second ends. A respective first end is coupled to a respective one of the more than two amplifiers. The second ends are coupled together to produce an output signal that is amplification of the input signal at the desired power level. Quarter wavelength transmission line equivalent networks also may be used. For example, Pi-networks including capacitors and inductors may be used.

The phase of each of the more than two signals may be controlled by phase modulating, and preferably by quadrature modulating, each of the more than two signals of constant amplitude and controlled phase to produce the output signal that is an amplification of the input signal at the desired power level. Phase modulating preferably takes place using a separate phase locked loop for each of more than two signals of constant amplitude.

According to another aspect of the CIP Application, a signal of varying amplitude and varying phase is generated from a plurality of constant amplitude varying phase signals, the sum of which is the signal of varying amplitude and varying phase. An IQ waveform generator generates a cosine carrier modulation waveform I(t) and a sine carrier modulation waveform Q(t) from the signal of varying amplitude and varying phase. A function generator generates a complimentary waveform Q'(t) from the cosine carrier modulation waveform I(t) such that the sum of squares of I(t) and Q'(t) is constant. A first modulator modulates a cosine carrier signal with I(t) to obtain a first modulated cosine carrier. A second modulator modulates a sine carrier signal with Q'(t) to obtain a first modulated sine carrier. A circuit such as a butterfly circuit forms the sum and difference of the first modulated cosine carrier and the first modulated sine carrier to obtain the constant amplitude varying phase signals.

A second function generator generates a complimentary waveform I'(t) from the sine carrier modulation waveform Q(t) such that the sum of squares of I'(t) and Q(t) is constant. A third modulator modulates a cosine carrier signal with I'(t) to obtain a second modulated cosine carrier. A fourth modulator modulates a sine carrier signal with Q(t) to obtain a second modulated sine carrier. A second circuit such as a second butterfly circuit forms the sum and difference of the second modulated cosine carrier and the second modulated sine carrier to obtain a second set of constant amplitude varying phase signals.

Accordingly, the CIP Application can combine more than two constant amplitude, varying phase vectors to obtain a given resultant vector, the combined vectors being of more slowly varying phase. In one aspect, four constant amplitude power vectors are combined. A first pair of signal vectors is generated, amplified and combined to produce a constant phase, varying amplitude vector, representing the real part of the desired resultant. A second pair of signal vectors is generated, amplified and combined to produce a second, constant phase, varying amplitude vector representing the desired imaginary part of the resultant, i.e. a vector at right angles to the real part. Each of the four constant amplitude vectors therefore may be limited in the rate of its required phase variation, allowing the use of lower phase locked loop bandwidths.

A preferred implementation uses a first quadrature modulator comprising a cosine and a sine or I and Q modulator to generate an amplitude modulated cosine carrier signal and an amplitude modulated sinewave carrier signal. The modulated cosine and sine signals are then both added and subtracted to generate two counter-rotating, constant-amplitude vectors whose resultant sum is a cosine signal of amplitude equal to a desired real part. The desired real part is the I-modulation applied to the cosine modulator. The Q-modulation is the square root of $(1-I^2)$, which ensures constant amplitude for both I+jQ and I−jQ. A second quadrature modulator modulates a sine carrier with the desired imaginary or Q part of the desired resultant signal while modulating a cosine carrier with the square root of $(1-Q^2)$, thus ensuring that, after forming jQ+I and jQ−I, they are both counter-rotating constant amplitude vectors the sum of which is the desired imaginary part. The four constant-amplitude vectors are then power-amplified, for example by using four phase locked loops to transfer the four varying phases to the output of respective power amplifiers at a desired final frequency for transmission.

Any number of constant-amplitude, varying-phase vectors greater than two, for example three, may be generated in such a way that their resultant sum is a desired varying amplitude, varying phase vector. The desired varying amplitude, varying phase vector has two components specified, being the real and the imaginary part respectively. However, the combination of more than two constant amplitude vectors provides excess degrees of freedom, which may be used according to the CIP Application to choose a solution which can reduce and preferably minimize the maximum rate of change of phase of any vector. This solution may be computed by digital signal processing, either in real time, or alternatively, for digital modulations, can be computed off-line for various combinations of successive modulation symbols and stored in a look-up table for use later in generating signals in real time.

FIG. 1 shows how a varying amplitude vector can be constructed by adding two constant amplitude vectors with correct relative phasing, as first proposed by Chireix in his 1935 paper. The inner circle indicates maximum amplitude for one power amplifier, and the outer circle indicates maximum amplitude for two equal power amplifiers. As shown, the desired amplitude is A(t) and the desired phase is $\phi(t)$. This may be obtained using first in-phase and quadrature signals I1 and Q1 and second in-phase and quadrature signals I2 and Q2, where I1=COS($\phi-\alpha$), Q1=SIN ($\phi-\alpha$), I2=COS($\phi+\alpha$), and Q2=($\phi+\alpha$), where $\alpha$=arcos(A/2).

Figure 2:
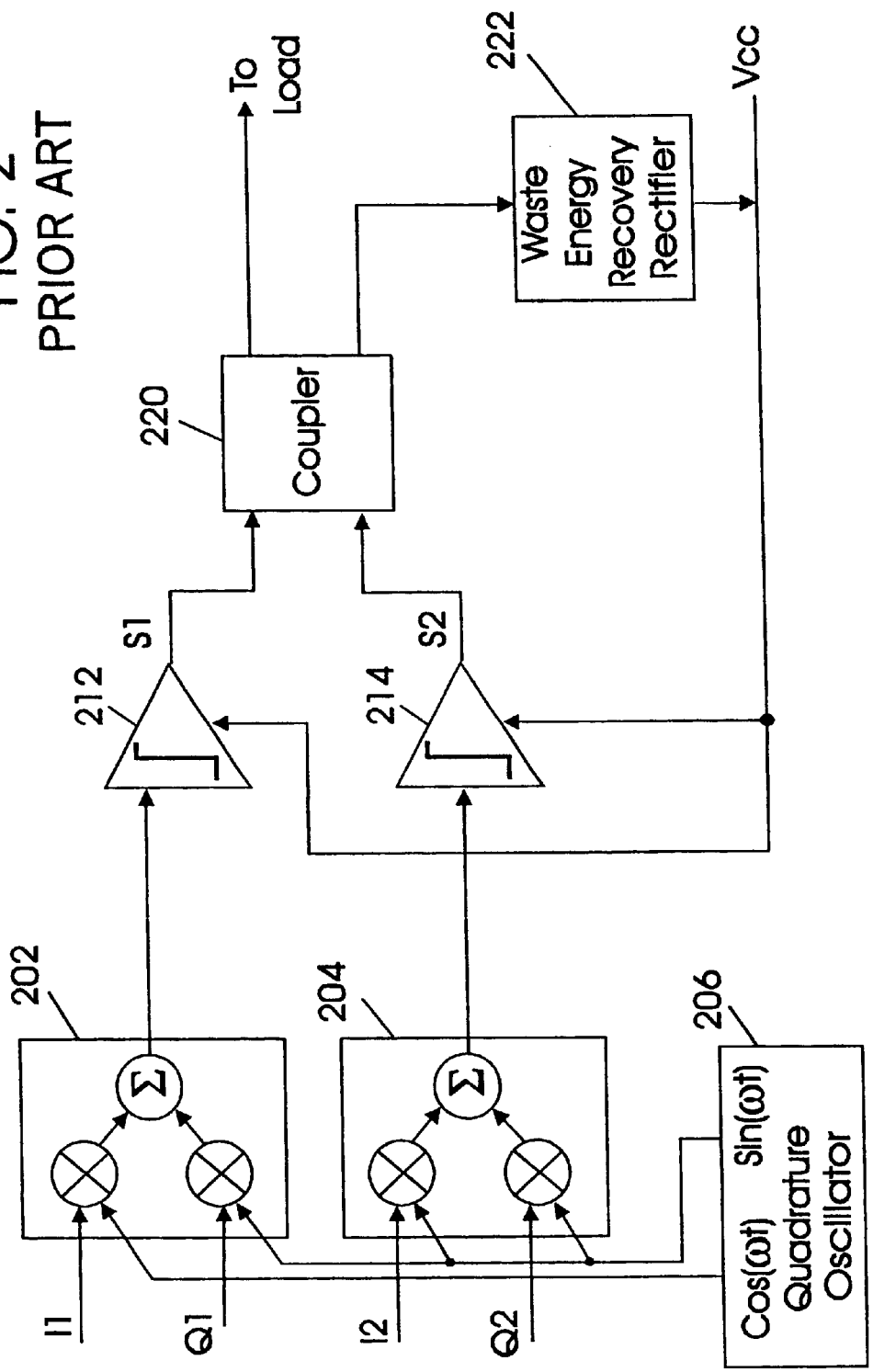
FIG. 2 is a block diagram of a conventional power amplifier using quadrature modulators and a pair of isolated power amplifiers.

In that era, Chireix did not have the benefit of modern digital signal processing technology to accurately generate the two out-phased signals. A modern implementation using two quadrature modulators 202, 204 driven by digitally synthesized vector waveforms I1, Q1, I2, Q2 and a quadrature oscillator 206 is shown in FIG. 2.

The output of the two power amplifiers 212, 214 each being for example, a class-C amplifier of power Pmax/2, can be added using a hybrid or −3 dB directional coupler 220 (coupling factor "k"=0.7071). A hybrid or directional coupler 220 effectively produces a sum and difference signal. Terminating the difference port and the sum port with like impedances gives isolation between the two power amplifiers so that power (voltage or current) from one does not reach the other. The sum signal rises to Pmax when both amplifiers are driven in phase, and falls to zero when they are driven 180 degrees out of phase. In between, the power is Pmax·$\cos^2(\alpha)$ where '$\alpha$' is the relative phasing. The difference output is Pmax·$\sin^2(\alpha)$ and the sum of the outputs is thus always Pmax.

When the desired output P(t) is less than Pmax, the difference Pmax−P(t) comes out the difference port and is normally lost. The average efficiency in this case may be even worse than that calculated above for class-B, as the battery current does not reduce when the output is less than Pmax. On the other hand, there is a possibility that constant envelope amplifiers can be constructed in practice with higher efficiency (at Pmax) than amplifiers with a linearity requirement, so that in practice an advantage may be obtained. However, even if a class-C efficiency of 100% could be obtained, the arrangement would only give 50% efficiency with a peak-to-mean power ratio of 3 dB, and 25% with a peak-to-mean ratio of 6 dB.

To help the efficiency, coinventor Dent proposed in the above-incorporated Dent patents to recover the energy normally dissipated at the difference port of the output coupler. A waste energy recovery rectifier 222 is used to rectify the dissipated energy and feed the DC current back to the battery. It is known that very efficient rectifiers can be made even at microwave frequencies, as research on wireless power transmission using microwaves has demonstrated.

For digital modulation signals, it is known that the number of different I and Q waveforms that are needed over a data bit interval can be limited to two to the power of a small number of bits surrounding the current bit, because data bits further removed from a current data bit have negligible effect. Thus the waveforms I1, Q1, I2 and Q2 may be precomputed for all two to the power N combinations of nearby bits and stored in memory, and recalled when needed. In that way, the need to compute arc-cosines in real time may be avoided.

Figure 3:
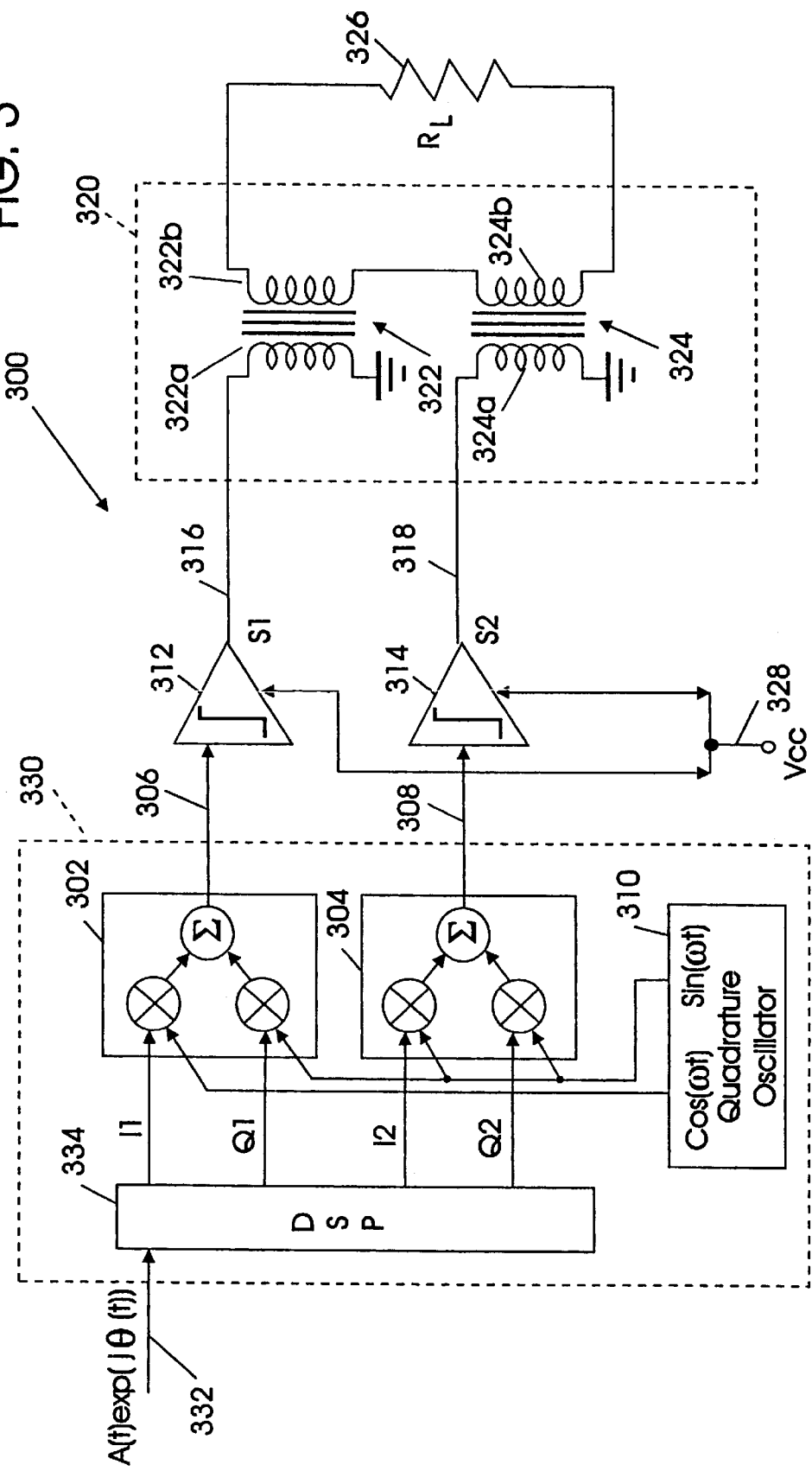
FIG. 3 is a block diagram of a first embodiment of power amplifiers according to the Parent Application.

Referring now to FIG. 3, a first embodiment of a power amplifier 300 according to the Parent Application is described. Power amplifier 300 amplifies an AC input signal 332 of varying amplitude and varying phase to produce an amplified output signal voltage and an output current in a load impedance $R_L$ 326 using a DC power supply VCC 328. It will be understood that the load impedance 326 may be an antenna and the DC power supply 328 may be a battery.

Still referring to FIG. 3, the power amplifier 300 includes converting means 330 for converting the AC input signal 332 into a first signal 306 having constant amplitude and a first phase angle and into a second signal 308 having constant amplitude and a second phase angle. Converting means 330 may be formed by a digital signal processor (DSP) 334 that generates I1, Q1, I2 and Q2 signals. First and second quadrature modulators 302, 304 respectively, are responsive to a quadrature oscillator 310 and to the in-phase and quadrature signals I1, Q1, I2, Q2 to produce the first signal 306 and second signal 308. The design and operation of converting means 330, and the individual components thereof, are well known to those having skill in the art and need not be described further herein.

Still referring to FIG. 3, a first amplifier 312 amplifies the first signal 306, to produce a first output signal voltage S1 (316) of constant voltage amplitude. As will be described in detail below, the first amplifier 312 preferably includes bilateral amplifier devices that draw current from the DC power supply, but that also supply current to the DC power supply. Accordingly, the connection between first amplifier 312 and DC power supply 328 is shown to be bidirectional.

Still referring to FIG. 3, a second amplifier 314 amplifies the second signal 308 to produce a second output signal voltage of constant voltage amplitude S2 (318). As was described above, the second amplifier 314 also preferably includes bilateral amplifier devices that draw current from the DC power supply and supply current to the DC power supply. Amplifiers 312 and 314 may be class-C power amplifiers, although other classes of power amplifiers may also be used.

Still referring to FIG. 3, a coupler 320 couples the first and second amplifiers 312 and 314 to each other and to the load impedance 326 such that the voltage or current in the first amplifier become linearly related to the voltage or current in the second amplifier. Coupler 320 may be contrasted from a directional coupler that was used in a conventional Chireix circuit. In particular, the coupler 320 does not isolate the first and second amplifiers from one another. Rather, it interactively couples the first and second amplifiers to one another, so that each affects the other's load line.

In FIG. 3, the coupler 320 comprises a first transformer 322 and a second transformer 324. Their respective secondaries 322*b* and 324*b* are series-coupled across a load impedance 326. Their respective primaries 322*a* and 324*a* are coupled to the outputs 316 and 318 of first and second amplifiers 312 and 314 respectively. Accordingly, the sum of the first and second output signal voltages S1 and S2 produces the amplified output signal voltage across the load impedance 326 and also produces the output current through the load impedance. An amplifier current that is linearly related to the output current flows in the bilateral amplifier devices of both the first and second amplifiers 312 and 314.

The transformers 322 and 324 facilitate the series coupling of outputs that are relative to ground. The series coupling can ensure that the same current, equal to the load current or a scaled value thereof, flows in the output circuits of both amplifiers 312 and 314.

By omitting the output coupler of FIG. 2, which isolated the two amplifiers from each other, the amplifiers are now allowed to affect or interact with each other. In particular, when the two amplifiers are driven out of phase so that output signal S1 equals −S2, the sum of their outputs into load impedance RL will be zero and there will be no load current. Therefore, the current flowing in the amplifier devices will also be zero due to the series connection, which ensures that both amplifier currents and the load current are the same. If no current flows in the amplifier devices, the current consumed from the DC supply voltage Vcc will also be zero. Thus in contrast to the coupled power amplifiers of FIG. 2, which consume a constant amount of power from the supply even when the instantaneous load power is zero, the arrangement of FIG. 3 can reduce its current consumption as the instantaneous output power is reduced.

Figure 4:
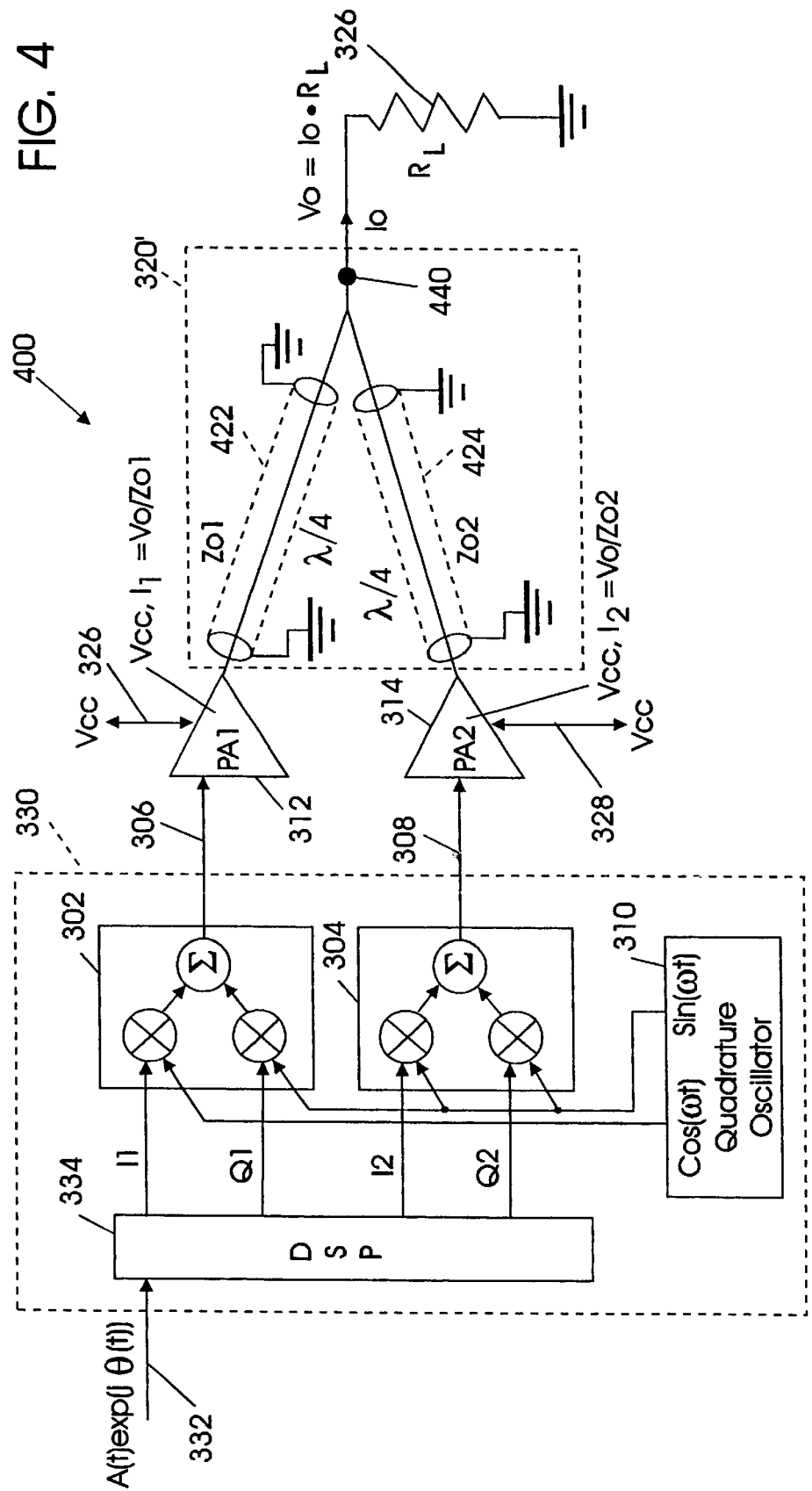
FIG. 4 is a block diagram of a second embodiment of power amplifiers according to the Parent Application.

Referring now to FIG. 4, a second embodiment of power amplifiers according to the Parent Application is shown. As shown in FIG. 4, power amplifier 400 is similar to power amplifier 300 of FIG. 3. However, the interactive coupler 320' that couples the first and second amplifiers 312 and 314 to the load impedance 326 is embodied by first and second quarter wavelength transmission lines 422 and 424 respectively. The load impedance includes an input node 440, and the first and second quarter wavelength transmission lines 422 and 424 are preferably coupled to the input node 440.

As illustrated in FIG. 4, series connection at microwave frequencies may be more practically achieved by parallel connection a quarter wave distant, using the two quarter wave lines 422 and 424. When the outputs of the two quarter wave lines are paralleled, the output voltages are forced to be the same (Vo) at the input node 440. This forces the currents to be the same quarter-wave away at the power amplifiers 312 and 314, if the lines are of equal impedance, creating the same conditions as in the series connection of FIG. 3. If the transmission lines are of different impedance 201, 202, the power amplifier output currents I1 and I2 are forced to be scaled in the inverse ratio of the impedances.

The power amplifiers ideally each generate an output swing of Vcc at their ends of their quarter wave lines. Since the voltages are the same at that end, the currents at the other end one quarter wave away must be equal with equal lines. With unequal line impedances, the currents will be respectively Vcc/Zo1 and Vcc/Zo2 at the junction of the lines. The total output current is thus Io=Vcc (1/Zo1+1/Zo2) or 2Vcc/Zo for equal lines.

If the power amplifiers generate relatively phased currents Vcc·EXP(jα) and Vcc·EXP(−jα), then the total output current is:

$$Io = VCC \left( \frac{\text{EXP}(j\alpha)}{Zo} + \frac{\text{EXP}(-j\alpha)}{Zo} \right)$$
$$= 2Vcc \cdot \text{Cos}(\alpha)/Zo,$$

assuming equal impedance Zo lines.

The voltage Vo is thus given by:

$$Io \cdot R_L = \frac{2Vcc \cdot R_L \text{Cos}(\alpha)}{Zo}$$

This in turn forces the power amplifier currents to be:

$$\frac{2Vcc \cdot R_L \text{Cos}(\alpha)}{Zo^2}$$

showing that the peak current in each power amplifier has reduced by Cos(α), which it did not do in the case of hybrid coupling. When α=90 degrees, the power amplifiers are antiphased, the output signals Vo, Io are zero, but so is the power amplifier current even though they are still driven to full Vcc output swing. It is as if the load impedance had been increased to infinity. Thus, by modulating α (in the DSP code), the effective load impedance seen by the power amplifiers is also modulated so that they generate only the instantaneously desired output power.

To obtain maximum efficiency, it is desirable to avoid harmonic currents flowing in the power amplifier output circuits. This may be obtained using a series resonant circuit in series with the power amplifier output terminal to present a low impedance to the fundamental and a high impedance to harmonics. However, a single shunt resonant circuit 550 may instead be connected one quarter wave away at the node of the two quarter wave lines, as shown in amplifier 500 of FIG. 5. The shunt resonator forces the voltage waveform to be sinusoidal at the junction of the lines (node 440), and therefore one quarter wave away the current at the power amplifier devices is forced to be sinusoidal.

Figure 6:
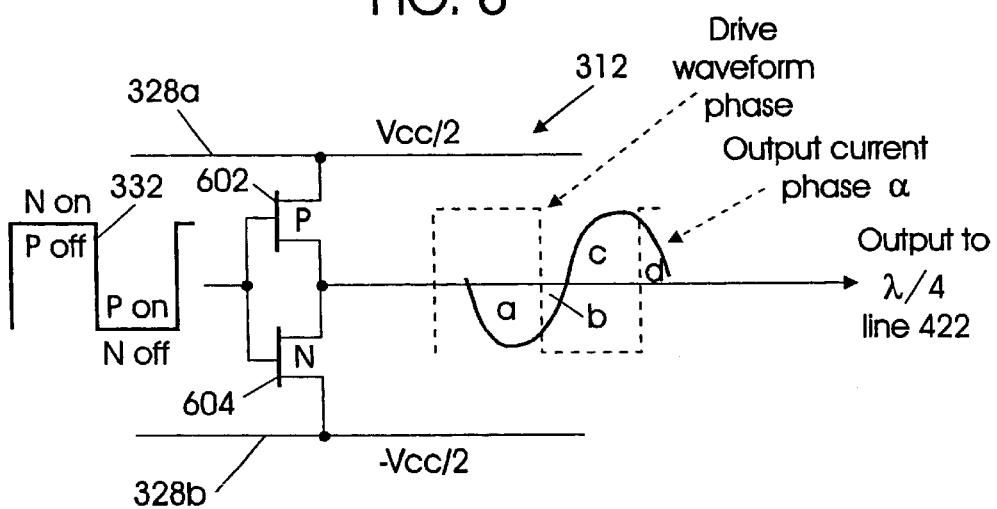
FIG. 6 is a circuit diagram of current and voltage relations in a power amplifier that uses bilateral devices.

As described above, the first and second amplifiers 312 and 314 respectively preferably include bilateral amplifier devices that draw current from the DC power supply 326 and supply current to the DC power supply. Accordingly, during part of the signal cycle of the AC input signal 332, current flows from the first and second amplifiers to the DC power supply to return energy to the DC power supply. FIG. 6 illustrates an embodiment of a power amplifier including bilateral amplifier devices according to the Parent Application.

As shown in FIG. 6, an embodiment of power amplifier 312 includes a P-type field effect transistor 602 and an N-type field effect transistor 604 that are respectively coupled between positive and negative power supplies 328*a* and 328*b* respectively. Input signal 332 is coupled to the P-type field effect transistor 602 and the N-type field effect transistor 604. These field effect transistors produce an output signal that is provided to the quarter wavelength line 422. Similar considerations apply to second amplifier 314.

When α is between 0 and 90 degrees, the sinusoidal current in the power amplifier devices is not in phase with the switching of the devices on and off, as illustrated in FIG. 6. As also shown in FIG. 6, the mean current from the power supplies is reduced by a further factor of cos(α) relative to the peak current Ipk. Since Ipk also reduces with cos(α), the net supply current reduces as $\cos^2(\alpha)$, which is the same factor by which the output power is reduced by modulating $\alpha$. The supply power and load power both therefore track, maintaining the same theoretical efficiency when backed off as when not. This relies on the use of bilateral power amplifier devices which can pass current in the reverse direction during part of the input signal cycle, returning energy to the battery.

That the theoretical efficiency using ideal bilateral devices is 100% may be understood in the context of a single ended push-pull output stage, as shown in FIG. 6. In region "a" from 0 to ($\pi$–$\alpha$), the current flows from –Vcc/2 to the load, while the N-type device is on, pulling down. This is delivering energy from –Vcc/2 source 328b to the load. In region "b", current is still negative, but the P-type device is on. That means current and energy are flowing back towards the +Vcc/2 source 328a. In region "c", current is flowing from the Vcc/2 328a source to the load while the P-type device is on, and in region "d", current is still negative when the N-type device comes on, sending current and energy back to the –Vcc/2 source 328b. The mean currents are thus:

$$\frac{Ipk}{2\pi}\left[\int_0^{\pi-\alpha}\sin(\theta)\delta\theta - \int_0^{\alpha}\sin(\theta)\delta\theta\right] = I_{pk}\cos(\alpha)/\pi$$

from each of the –Vcc/2 and +Vcc/2 supplies, that is reduced by the factor $\cos(\alpha)$ compared to an in-phase current.

In FIG. 6, the mean supply currents from the split supplies –Vcc/2 and +Vcc/2 are computed to be Ipk/$\pi$ when $\alpha$=0. The total power from both supplies is therefore:

$$Ipk \cdot Vcc/\pi. \tag{1}$$

Figure 5:
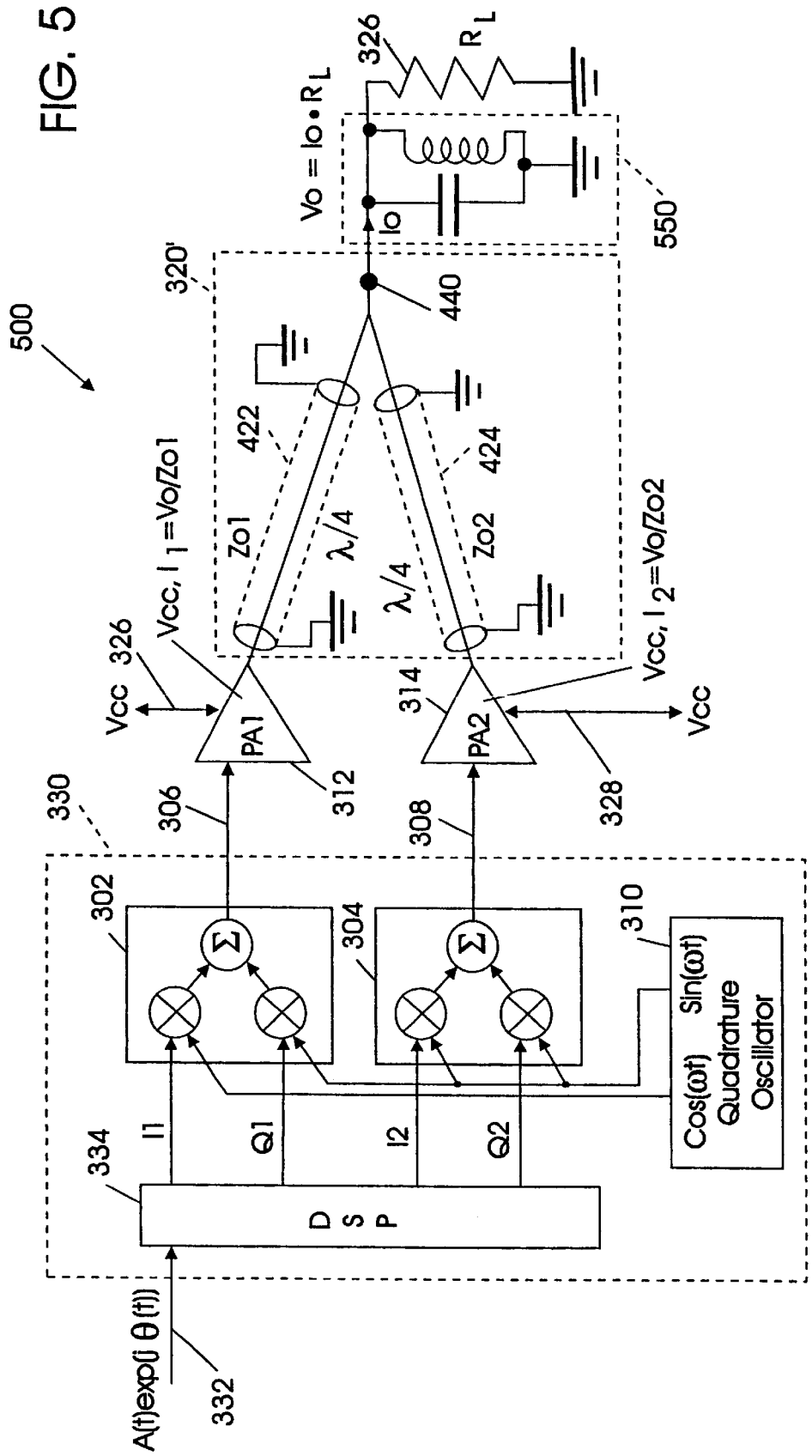
FIG. 5 is a block diagram of a third embodiment of power amplifiers according to the Parent Application.

The square-wave voltage swing at the single-ended power amplifier output is –Vcc/2 to I–Vcc/2 i.e. Vcc/2 peak, so the current at the end of a quarter wave line of impedance Zo must be a square wave of peak current +/–Vcc/2Zo. The fundamental component of a square wave is 4/$\pi$ times the peak, so the fundamental current driving the resonator of FIG. 5 is:

$$\frac{2Vcc}{\pi \cdot Zo}\text{peak} \tag{2}$$

The current induces a peak load voltage of:

$$\frac{2Vcc \cdot R_L}{\pi \cdot Zo} \tag{3}$$

The loud power is thus ½×peak current×peak voltage:

$$= \frac{2Vcc^2 \cdot R_L}{(\pi \cdot Zo^2)} \tag{4}$$

Equation (3) gives the sinusoidal voltage swing on the resonator at the end of the quarter wave line. Thus, the current at the power amplifier device end of the line is this divided by Zo, i.e.:

$$Ipk = \frac{2Vcc \cdot R_L}{\pi \cdot Zo^2} \tag{5}$$

Substituting for Ipk from equation (5) into equation (1) gives the total DC input power as:

$$= \frac{2Vcc^2 \cdot R_L}{(\pi \cdot Zo)^2} \tag{6}$$

which is the same as equation (4), showing that the efficiency is 100%

Figure 7:
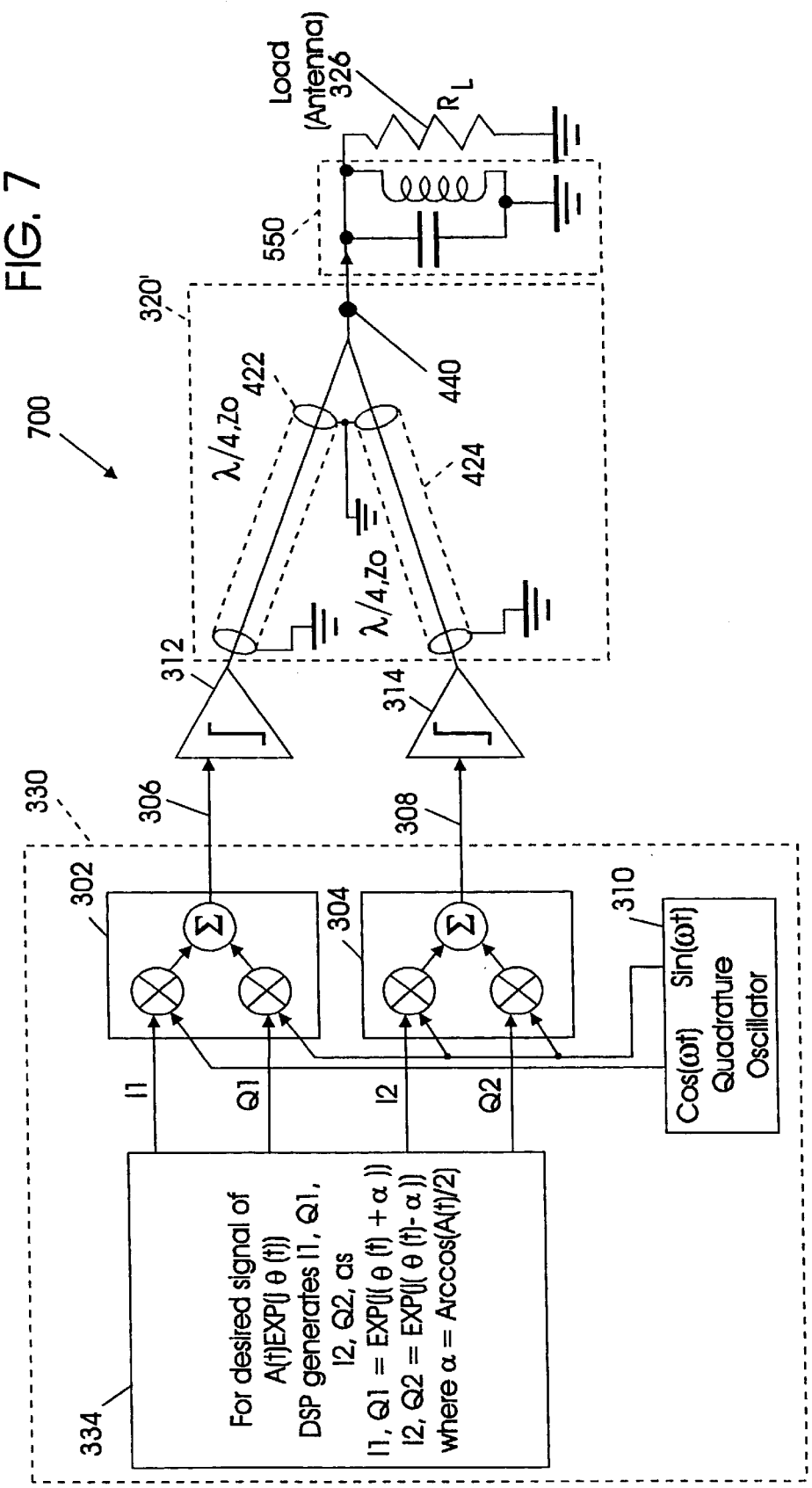
FIG. 7 is a block diagram of a fourth embodiment of power amplifiers according to the Parent Application.

It is well known that a switch-mode inverter with lossless filtering to convert a square-wave to a sine-wave output gives theoretical 100% efficiency. However, in the arrangement of FIGS. 3 to 6, which is encapsulated in the embodiment of a transmitter of FIG. 7, the efficiency is maintained even for signals of varying amplitude, or when the transmitter is backed off to less than full output. In FIG. 7, amplifier 700 can use switch-mode (class-D) power amplifiers. The load 326 is an antenna. Thus, the present invention, which has no theoretical limitations to efficiency, is a better starting point than prior art power amplifiers, the theoretical efficiency of which is already less than 100% even with ideal devices.

Figure 8:
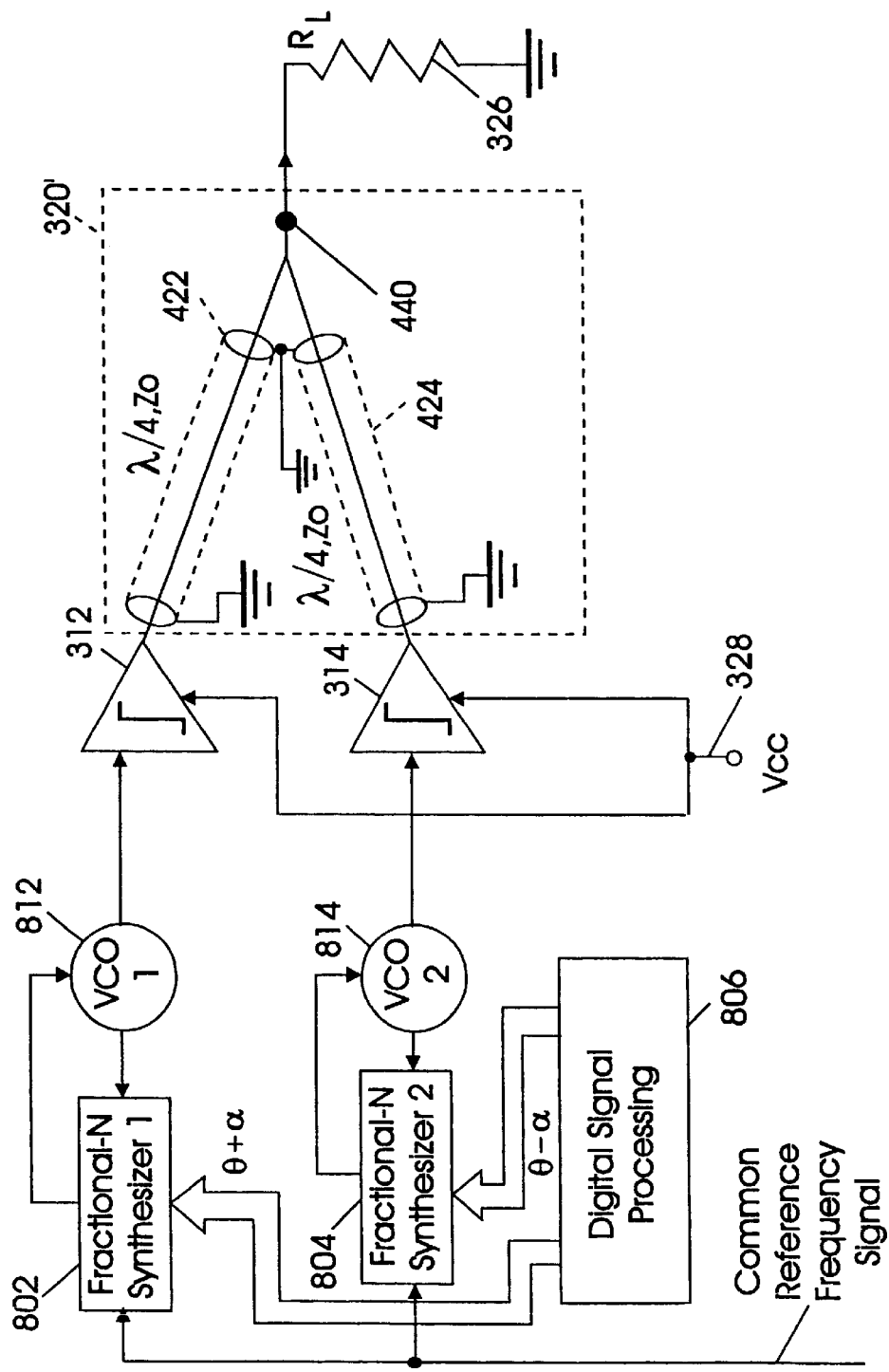
FIG. 8 is a block diagram of a fifth embodiment of power amplifiers according to the Parent Application.

The Parent Application uses means, such as a digital signal processor (DSP) 334, to convert a complex modulation signal having a varying amplitude and a varying phase into two modulation signals having constant amplitude and differently varying phases. It then uses means to produce two signals modulated by respective phase modulation signals. One means has been illustrated in FIG. 2, namely the use of two quadrature modulators 302, 304 driven respectively by the cosine and sine of their respective phase modulation signals. Another technique is shown in the embodiment of FIG. 8, wherein two frequency synthesizers, each modulatable in phase, such as modulatable fractional-N synthesizers 802 and 804 are used. A modulatable fractional-N synthesizer comprises an accumulator whose value determines the phase of an oscillator 812, 814 controlled by the synthesizer. Normally in a fractional-N synthesizer, the accumulator augments continuously (with wraparound) by the repeated addition of a slope value, which provides a frequency offset. To change the phase, the accumulator may be additionally augmented by adding once only a value equal to the change of phase desired. This arrangement is shown in FIG. 8.

Using two separate fractional-N synthesizers 802, 804, the cumulative nature of the delta-phase values added may get out of step. In practice therefore, the need to maintain synchronism suggests that the two synthesizers should be combined into a single chip. Moreover, the type of synthesizer called a "reciprocal fractional-N" disclosed by coinventor Dent in U.S. Pat. No. 5,834,987, issued Nov. 10, 1998, entitled Frequency Synthesizer Systems And Methods For Three-Point Modulation With A DC Response, assigned to the assignee of the present application, the disclosure of which is hereby incorporated herein by reference, may be advantageous, as it modulates the reference divider controlled by a fixed reference frequency, which is then easier to synchronize when two modulated synthesizers are required.

Another directly phase-modulatable synthesizer technique is the Direct Digital Synthesizer or DDS, in which an accumulator computes the value of ($\omega$t+$\phi$) continuously and converts the most significant part to a sine wave using a sine look-up table. Any other conventional method of producing phase modulated signals can also be used with the Parent Application.

When an embodiment of the invention of the Parent Application is to be used to generate signals that vary both in amplitude and phase, the two constant envelope amplifiers generate signals that vary in phase by the sum and difference respectively of the desired phase variation and an amplitude determining phase component. When the variation of both phase components is in the same direction, the sum phase varies faster; otherwise the difference phase varies faster. One phase thus varies faster than the other and the rate of phase variation can become very large when the desired signal vector has a trajectory that passes close to the origin (0,0) of the complex plane. If the signal vector passes exactly through the origin, i.e. the signal amplitude goes to zero, both phase variations have finite derivatives. However, for a vector that passes infinitesimally close to the origin, the phase derivatives can be arbitrarily large.

It is a potential advantage that constant amplitude signals varying only in phase can be produced using modulated phase locked loops. However, the rate of change of phase produced by a phase locked loop generally is limited by its loop bandwidth. It is desired to avoid using excessively wide loop bandwidths so that the phase locked loop helps to filter out unwanted noise and prevent wideband noise from being transmitted. However, the use of narrow phase locked loops may limit the ability to accurately reproduce complex signal vector trajectories that pass close to the origin. The CIP Application can resolve this design conflict and can permit the use of more desirable phase locked loop parameters without impacting the accuracy with which complex signal trajectories can be reproduced.

Figure 9:
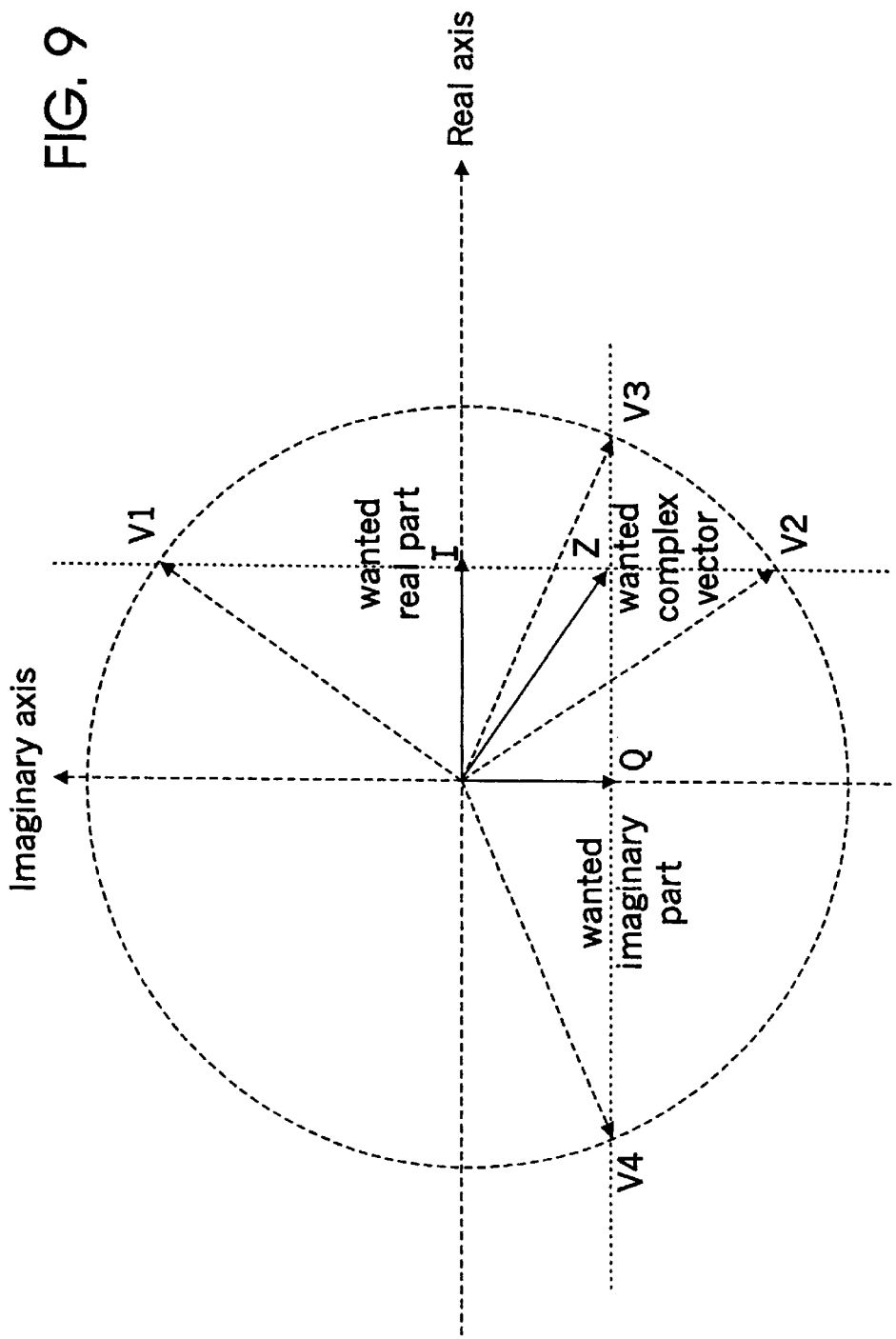
FIG. 9 graphically illustrates synthesis of a complex vector using four constant magnitude vectors according to the CIP Application.

A first embodiment is described with the aid of FIG. 9. FIG. 9 shows synthesis of a complex vector Z by separately synthesizing its real part I and its imaginary part Q. These are each in turn synthesized by adding pairs of constant-amplitude, counter-rotating, variable-phase vectors. Thus, FIG. 9 shows addition of four constant amplitude vectors, V1, V2 (which combine to yield the real part I) and V3, V4 (which combine to yield the imaginary part Q).

An advantage of using a pair of vectors to synthesize only the real or the imaginary part is that the trajectory of the real or imaginary part alone must pass through the origin exactly upon changing sign. The rate at which the value passes through zero is limited by the finite bandwidth of the complex signal being synthesized. Thus, the rate of rotation of each of the four vectors V1, V2, V3 and V4 may be guaranteed to be finite when synthesizing a finite bandwidth signal. Moreover, each of the vectors only ever has to rotate through +/−90 degrees relative to a mean phase, in order to produce a real or imaginary part varying between plus the maximum and minus the maximum signal amplitude. Thus the design of phase locked loops may be eased compared to the use of only two constant amplitude vectors, where the phase of each vector can need to rotate through the full 360 degrees and continue rotating through any multiple of 360 degrees.

Figure 10:
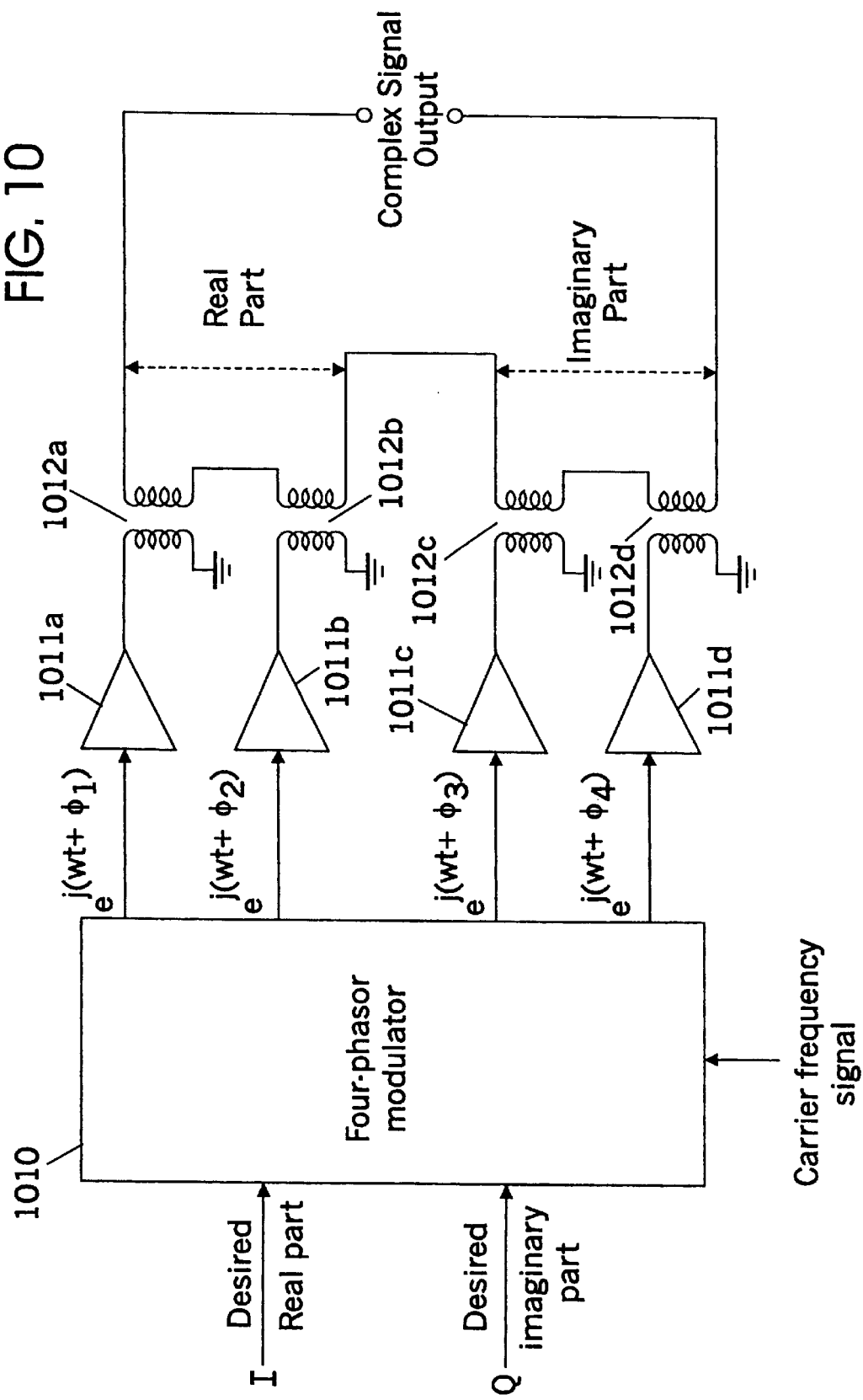
FIG. 10 is a block diagram of an embodiment of systems and methods for defining an input signal of varying amplitude and varying phase to a desired power level using more than two signals of constant amplitude and controlled phase according to the CIP Application.

FIG. 10 shows an arrangement of four, coupled, constant-amplitude power amplifiers 1011a, 1011b, 1011c, and 1011d according to an embodiment of the CIP Application. A four-phasor modulator 1010 is fed with information on the desired signal to be transmitted, which can for example be described by the waveform of the real part I (cosine carrier component) of the complex signal and the waveform Q of the imaginary part (sine carrier component). Modulator 1010 produces four, constant amplitude, varying phase signals denoted by:

$e^{(jwt+\phi 1)}$ $e^{(jwt+\phi 2)}$ $e^{(jwt+\phi 3)}$ and $e^{(jwt+\phi 4)}$ where $\phi 1$=ARCCOS(I); $\phi 2$=−$\phi 1$; $\phi 3$=90−ARCCOS(Q) and $\phi 4$=180−$\phi 3$, and "w" is the frequency of the carrier frequency signal which may be supplied at another input.

Because the ARCCOS function is undefined for arguments greater than unity, the desired signal Z=I+jQ is properly scaled so that its peak amplitude never exceeds unity, and is preferably just less than unity. Scaling to a desired power level is accomplished by amplifiers 1011a . . . 1011d. The outputs of amplifiers 1011a, 1011b, corresponding to vectors V1, V2 of FIG. 9, are added in series using transformers 1012a and 1012b to produce the real part I. The real part I will consist of a cosine carrier component only that is modulated in amplitude from positive amplitudes to negative amplitudes, i.e. Double-SideBand, Suppressed Carrier modulation (DSBSC). Likewise, the outputs of amplifiers 1011c, 1011d corresponding to vectors V3, V4 of FIG. 9 are added in series using transformers 1012c, 1012d to produce the imaginary part Q, which is a DSBSC modulated sine carrier component. The outputs of all transformers are then coupled in series to add I and Q to obtain the desired complex signal modulation Z=I+jQ.

As disclosed in the Parent Application, series coupling causes the same output or load current to flow in all amplifier devices, irrespective of their voltage contribution to the total output signal. When that current is in phase with an amplifier's voltage contribution, that amplifier is delivering power from the DC source to the load. When the amplifier's voltage contribution is in antiphase with the load current, that amplifier acts as a synchronous rectifier and returns current to the DC source, providing bilateral output devices are used. When an amplifier's voltage contribution is 90 degrees out of phase with the load current, current is consumed from the DC source during part of the AC signal cycle and returned to the DC source during the other part of the cycle, consuming no net current from the source in the mean. Thus the only mean power consumed by amplifiers 1011a, . . . 1011d from their common DC source (not shown) corresponds to power delivered to the output circuit or load, which therefore corresponds only to the desired signal waveform Z. The theoretical efficiency of the amplifier with ideal bilateral amplifier devices is therefore 100%, in contrast to prior art linear amplifiers that have lower theoretical efficiencies even with ideal devices.

Figure 13:
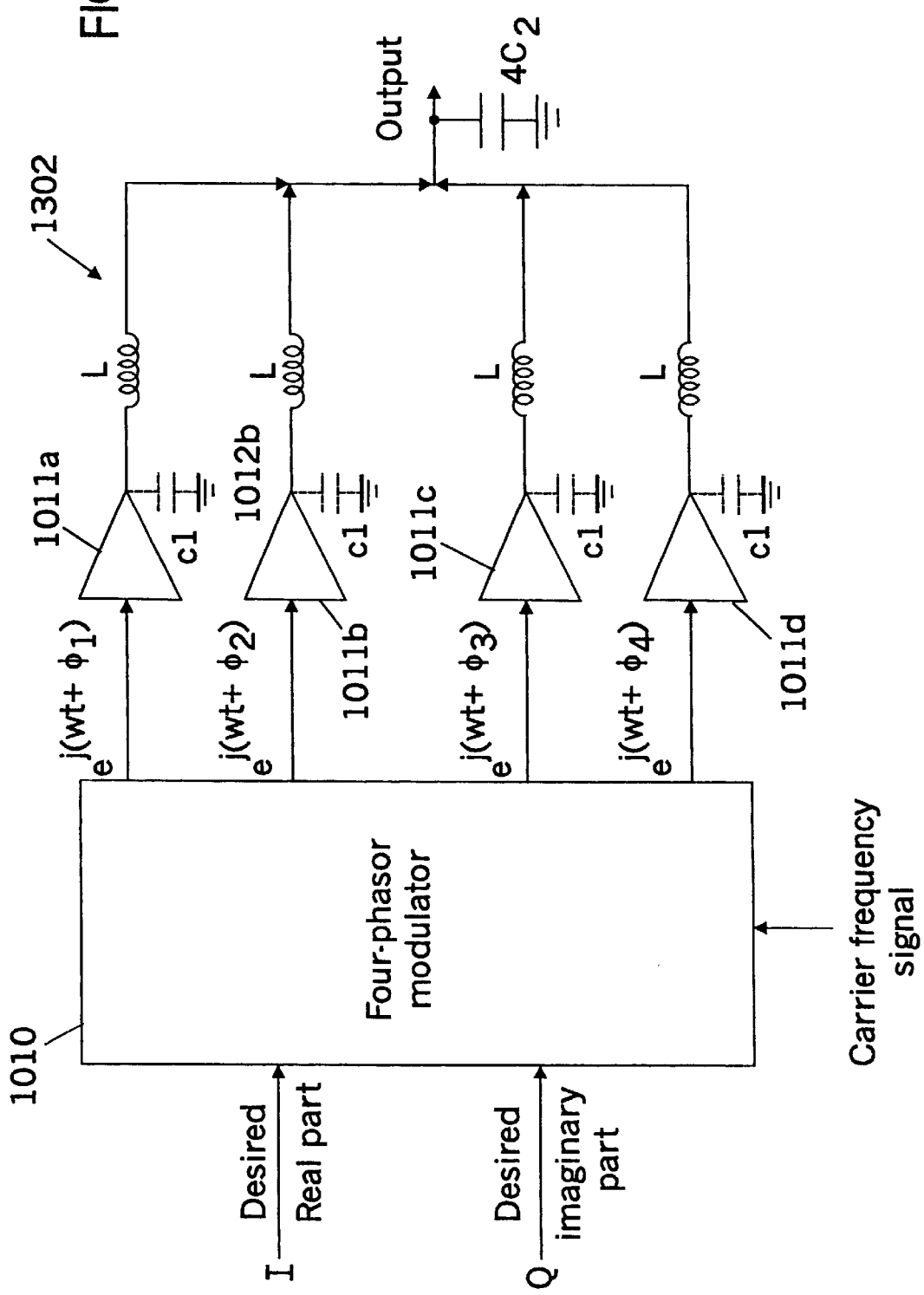
FIG. 13 is a block diagram of another embodiment of systems and methods for defining an input signal of varying amplitude and varying phase to a desired power level using more than two signals of constant amplitude and controlled phase according to the CIP Application.

For very high frequency and microwave operation, it was disclosed in the Parent Application that a more practical form of series coupling can be to use parallel coupling one quarter wavelength away from the amplifiers, using quarter wave transmission lines of appropriate impedance. The choice of impedance is made to match the amplifiers to the load impedance, e.g. an antenna, for generating the desired total output power. The length of the quarter-wave coupling lines should also be shortened as necessary to compensate for the output capacitance of the amplifier devices. Quarter-wave line equivalent circuits may also be constructed with discrete inductors and capacitors, for example in a Pi-network configuration 1302, as shown in FIG. 13. The first capacitor C1 of each Pi network C1, L, C2 can absorb the output capacitance of the amplifier devices while the second capacitors C2 can be combined into a single capacitance 4C2. Such networks preferably should be designed to reflect a high impedance at the amplifiers at as many odd harmonics as possible, using additional LC components, and the amplifiers should preferably be push-pull amplifiers that suppress even harmonics of the carrier frequency.

Figure 11:
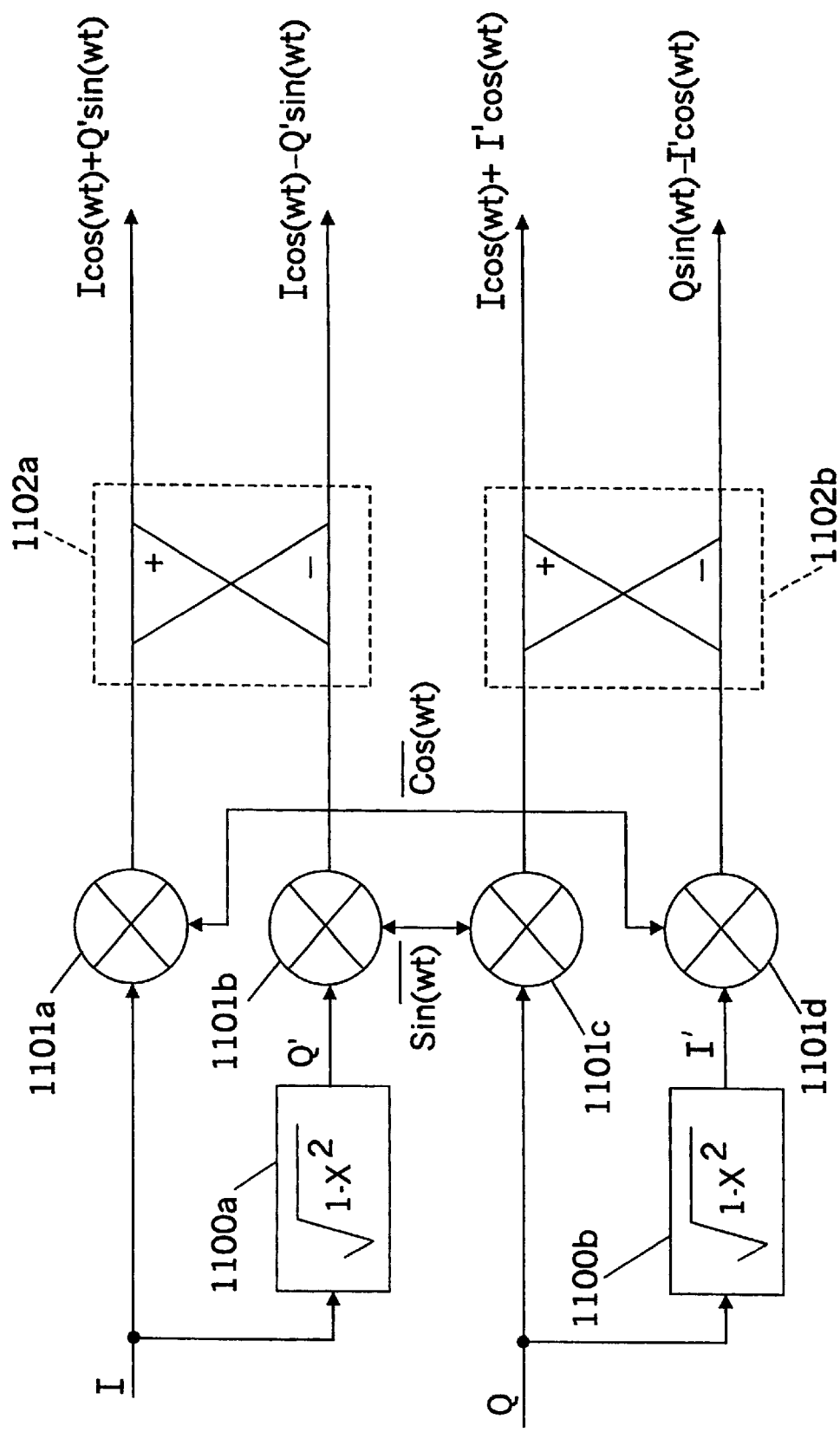
FIG. 11 is a block diagram of an embodiment of a four-phasor modulator of FIG. 10.

FIG. 11 shows more detail of an embodiment of a four-phasor modulator 1010 of FIG. 10. The I signal is fed to a first balanced modulator 101a where it multiplies a cosine carrier component to produce Icos(wt). The I signal is also fed to function generator 1100a that derives a signal Q' from I such that the sum of the squares of I and Q' is a constant. This is achieved if the function f(x) implemented by the function generator 1100a is a $\sqrt{1-x^2}$ function. Q' is fed to a second balanced modulator 1101b where it multiplies a sine carrier component to obtain Q'sin(wt). Butterfly circuit 1102a forms both the sum and the difference of the outputs of modulators 1101a, 1101b to obtain:

Icos(wt)+Q'sin(wt) and

Icos(wt)−Q'sin(wt), both of which have the constant amplitude $\sqrt{I^2+Q^2}$.

These two constant-amplitude drive signals correspond to vectors V1 and V2 of FIG. 9 and drive amplifiers 1011a, and 1011b of FIG. 10.

The desired Q signal component feeds a similar circuit except that Q multiplies the sine carrier component in balanced modulator 1101c and the derived signal I', derived using function generator 1100b, multiplies the cosine carrier in balanced modulator 1101d. Butterfly circuit 1102b then forms the sum and difference of the outputs of modulators 1101c and 1101d to obtain the two constant amplitude signals Qsin(wt) +I'cos(wt) and Qsin(wt)−I'cos(wt), which correspond to vectors V3 and V4 of FIG. 9, and drive amplifiers 1011c and 1011d of FIG. 10.

It is common to encode information for transmission and to convert coded information to baseband modulating signals I and Q using digital signal processing. I and Q may first be produced using digital signal processing as a sequence of numerical samples, which are then converted to analog waveforms by means of digital to analog (DtoA) converters. A technique for eliminating the DtoA converters is described in U.S. Pat. No. 5,530,722 to coinventor Dent, the disclosure of which is hereby incorporated by reference herein. The technique involves converting the numerical I/Q sample streams to high bitrate, sigma-delta modulation, which can then be converted to analog signals by low-pass filtering.

The balanced modulators 1101a, 1101b, 1101c and 1101d can, for example, be of the type known as Gilbert Cells, which are easy to fabricate in semiconductor processes. The output signal from a Gilbert Cell is a balanced (i.e. push-pull) current and the output of two Gilbert cells can therefore be added by paralleling their outputs to add their output currents. Reversal of the connections of one Gilbert cell then causes subtraction. Thus the Butterfly circuits 1102a, 1102b may be obtained by parallel coupling the outputs of Gilbert cells, using a reversal of connections to one Gilbert cell for the difference output. The current outputs from a Gilbert cell may be duplicated using current mirrors in order to obtain one balanced output for forming the sum and a similar balanced output for forming the difference. It is also known from the incorporated references that, for modulating data signals, the entire sigma-delta bitstream may be precomputed and stored in a look-up table for different, finite-length data symbol sequences and recalled by addressing the table with modulating data sequences to obtain the correct sigma-delta waveforms.

One of the potential benefits of synthesizing a signal for transmission using only phase-modulated signals is that the phase modulation may be applied to an oscillator running directly at the output frequency and with a power output that is higher than that achievable from prior art quadrature modulators. Thus the power amplifier may need less gain to amplify the oscillator output and thus amplifies wideband noise less. Preventing the power amplifier from amplifying wideband noise can help avoid interference from the transmitter to a receiver in the same or in a nearby apparatus, such as a cellular telephone. The technique of first generating a phase modulated signal at a transmit intermediate frequency and then transferring that phase modulation by means of a phase locked loop to a transmit frequency VCO is further described in U.S. Pat. No. 5,535,432 to coinventor Dent, the disclosure of which is hereby incorporated by reference and has been used in cellular phones conforming to the GSM digital cellular standard manufactured by L.M. Ericsson and sold in Europe since 1992. An application of this scheme is shown in FIG. 12.

Figure 12:
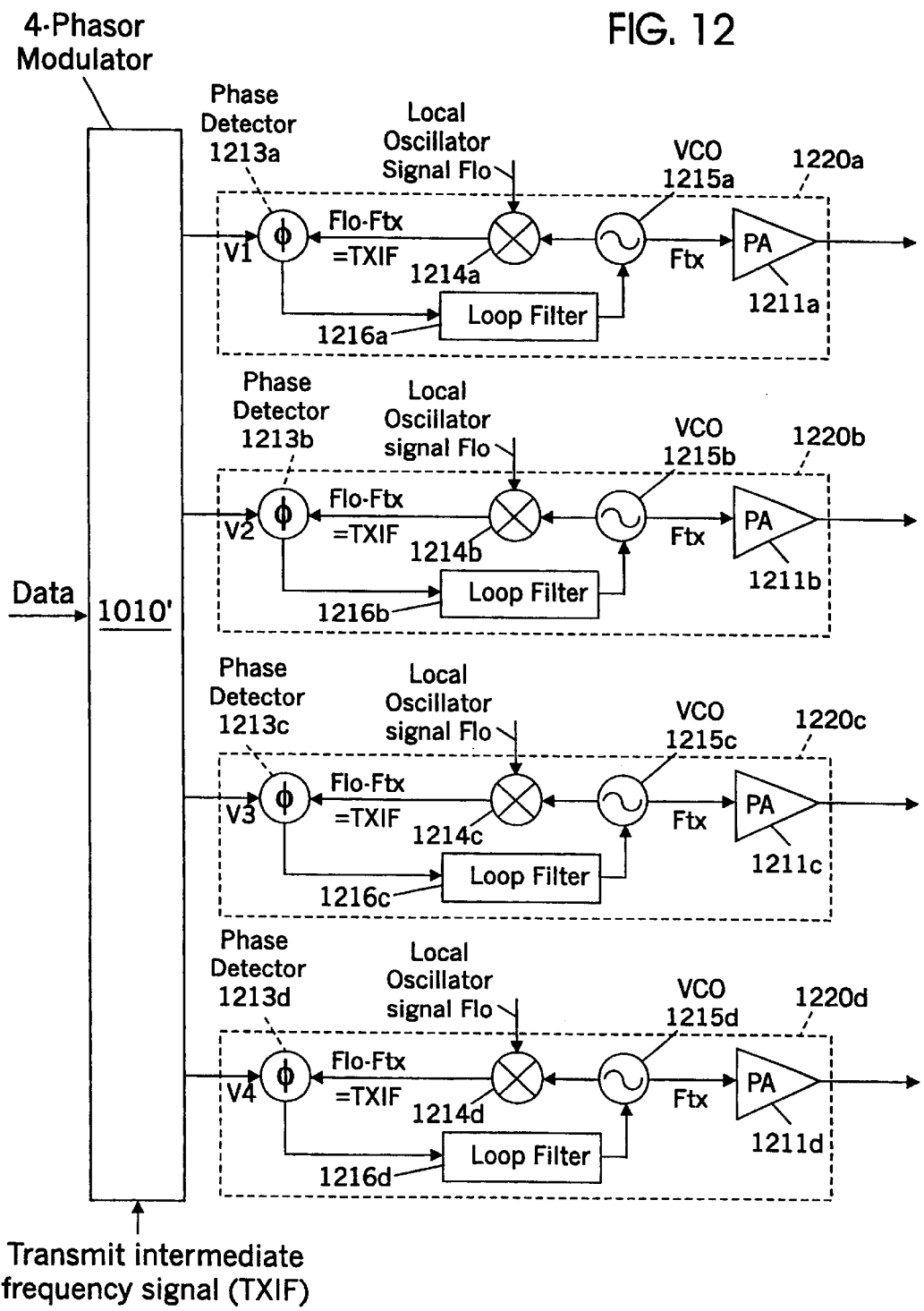
FIG. 12 is a block diagram of an embodiment of systems and methods for filtering a phase modulated signal using phase locked loops according to the CIP Application.

Referring now to FIG. 12, the four-phasor modulator 1010' produces phase modulated signals at a transmit intermediate frequency (TXIF). A transmit frequency voltage controlled oscillator 1215a produces a signal at transmit frequency Ftx which is amplified by power amplifier 1211a. A portion of the output of oscillator 1215a is fed to down-converting mixer 1214a where it is heterodyned with a local oscillator signal of frequency Flo, which is offset from the desired transmit frequency Ftx by the TXIF, i.e.

Flo=Ftx+/−TXIF.

In a cellular telephone, the local oscillator signal often is the same as already used in the receiving section, which is ensured by choosing TXIF correctly so that the transmit frequency is displaced from the receive frequency by an amount known as the "duplex spacing".

The difference frequency output from heterodyne down-converter (mixer 1214a) at a frequency TXIF is phase compared in phase detector 1213a with the phase-modulated TXIF signal from modulator 1010'. If the compared phases do not match, a phase error signal is generated by phase detector 1213a which is integrated in loop filter 1216a to produce a correcting control signal to VCO 1215a, thus controlling the phase and frequency of VCO 1215a to follow the phase modulation from modulator 1010'.

The entire Phase Locked Loop phase-transfer circuit 1220a comprising elements 1213a, 1214a, 1215a and 1216a and power amplifier 1211a is replicated as 1220b, 1220c and 1220d for the other three phasor channels. Four-phasor modulator 1010' is shown in FIG. 12 having a single data input rather than I and Q inputs. Thus, 4-phasor modulator 1010' is assumed to incorporate the conversion of data symbol sequences to I,Q waveforms, using, for example, precomputed look-up tables as discussed above.

When the transmit output frequency is to be changed between different channels, it now suffices to change the local oscillator frequency Flo, and the generated transmit signal will change to the new channel in step with the change to Flo. A benefit of using phase locked loops to transfer the phase modulation to the output frequency is that the phase locked loop bandwidth determined by loop filters 16a ... 16d need only have a bandwidth sufficient to pass the modulation accurately, and thus can help to reject wideband noise which could otherwise be amplified by power amplifiers 1211a ... 1211d, potentially interfering with a receiver.

Another aspect of the CIP Application will now be described that corresponds to the more general inventive principle of synthesizing a vector of variable phase and amplitude by combining more than two vectors of constant amplitude. One special case of combining four vectors was discussed in detail above with the aid of FIGS. 9 to 13. In that example, the vectors were combined in pairs to produce the real and the imaginary parts of the desired complex signal vector. An objective was to eliminate the likelihood of large rate-of-change of phases being needed on any vector. The excess degrees of freedom available in using more than two constant amplitude vectors to synthesize a complex vector may be more generally targeted to reduce the maximum rate-of-change of phase needed for any vector. The minimum rate-of-change of phase solution would not necessarily turn out to combine two vectors to generate the real part and two vectors to generate the imaginary part, and this would not be the solution if three of five vectors were used.

The general problem may be formulated mathematically as follows:

Find N phase waveforms $\phi(1) \ldots \phi(N)$ such that $$\sum_{k=1}^{N} e^{j\phi(k)} = Z(t),$$

a desired complex waveform and the largest $|\dot{\phi}(k)|$ is minimized.

An alternative goal is to minimize the sum of the squares of the phase derivatives, i.e.:

Find N phase waveforms $\phi(1) \ldots \phi(N)$ such that $$\sum_{k=1}^{N} e^{j\phi(k)} = Z(t),$$

a desired complex waveform and $$\sum_{k=1}^{N} |\dot{\phi}(k)|^2$$

is minimized.

The above can be restated as a standard Lagrange multiplier problem as:

Minimize $$\sum_{k=1}^{N} |\dot{\phi}(k)|^2$$

subject to $$\sum_{k=1}^{N} je^{j\phi(k)}\dot{\phi}(k) = \dot{Z}(t)$$

Splitting the above complex equation involving Z into its real and imaginary constituent waveforms I and Q, and defining the 2×N matrix A as:

$$[A] = \begin{bmatrix} \cos(\phi_1)\cos(\phi_2) \ldots \cos(\phi_N) \\ \sin(\phi_1)\sin(\phi_2) \ldots \sin(\phi_N) \end{bmatrix}$$

the Lagrange multiplier problem has the solution:

$$\begin{pmatrix} \dot{\phi}_1 \\ \dot{\phi}_2 \\ \vdots \\ \dot{\phi}_N \end{pmatrix} = A^{\#}[A \cdot A^{\#}]^{-1} \begin{pmatrix} \dot{Q}(t) \\ -\dot{I}(t) \end{pmatrix}$$

The above equation is a set of N, non-linear differential equations which can in principle be solved for the N phase waveforms, given the desired complex signal waveform Z(t), in terms of its real part I(t) and its imaginary part Q(t). Such a solution may be onerous to perform in real time, but as digital processors become ever more powerful and the real-time solution method may soon, if not already, be an economically practical implementation. The problem can be stated in discrete time steps of dt to obtain phase waveform samples in steps of dt, given the values of Z(t) at discrete steps dt as Z1=I1+jQ1; Z2=I2+jQ2 . . . etc.

The values of the phases at time step number "i" can then be derived from the above differential equation to be:

$$\begin{pmatrix} \phi_1 \\ \phi_2 \\ \vdots \\ \phi_N \end{pmatrix}_i = A^{\#}[A \cdot A^{\#}]^{-1} \begin{pmatrix} Q(i) - \overline{Q}(i-1) \\ \overline{I}(i-1) - I(i) \end{pmatrix} + \begin{pmatrix} \phi_1 \\ \phi_2 \\ \vdots \\ \phi_N \end{pmatrix}_{i-1}$$

where $\overline{I}, \overline{Q}$ are the previously achieved values given by $$\overline{I}(I-1) + j\overline{Q}(I-1) = \sum_{k=1}^{N} e^{j\phi k(i-1)}.$$

The use of the previously achieved I,Q values at timestep (i−1) as the stepping-off point from which to reach the new desired I,Q values at timestep "i" can ensure that computational errors such as rounding errors in the previously achieved values are compensated by computing the step change in the phase values necessary to move from the previously achieved values, including error, to the new desired values. Thus, computational errors may be prevented from accumulating.

In the above, the matrix A is computed again from the new phase values after every step. Also after every step, the new phase values are applied to a phase modulator, which can include any or all of digital to analog conversion of the phase values, filtering of the converted phase values, phase locked loops for transferring phase modulation to a desired transmitter output frequency, phase modulatable frequency synthesizers such as fractional-N synthesizers or Direct Digital Synthesizers (DDS), or alternatively reconversion of phase values to I,Q values using a Cosine/Sine function or table followed by the use of quadrature modulators to modulate each pair of I and Q values on to a desired radio frequency carrier signal to obtain N constant amplitude signals whose sum will be the desired phase and amplitude modulated signal.

When the desired modulation arises from a digital information signal, the computation can often be simplified, by utilizing the fact that the complex modulation waveform Z(t) is at each time a function of only a limited number L of past and future digital information symbols. Thus there are at each time only a limited number $M^L$ of possible values of Z(t) that can arise, where M is the size of the alphabet of possible information symbols. All possible waveforms of Z(t) can thus be precomputed for all possible sequences of M symbols. Likewise, using the above equations, all possible sets of N phase waveforms can be precomputed and associated with symbol sequences in a waveform look-up table. Actual information symbol sequences are then applied to address the table to extract the precomputed phase waveforms or equivalent I,Q waveforms, thus saving on real-time computation required. One advantage of precomputation is to detect and then avoid any tendency of the matrix A.A# to become singular by taking an alternative route between successive points that may temporarily depart from the minimum rate-of-change of phase solution in order to avoid the need for a greater rate of change of phase later.

Accordingly, in the CIP Application, an amplitude and phase-varying signal may be generated efficiently at a power level for transmission, based on series combining (or the equivalent) more than two amplified signals of constant power level. General methods and systems for computing the required phase variations of each of the constant amplitude signals were presented that may be used for three or more signals. Embodiments of methods and systems for generating and combining four signals have also been presented, which may be simpler and may be a preferred solution.

Embodiments of the present invention can amplify a signal using fixed and modulated power supply voltages, and buck/boost control. In particular, an embodiment of the present invention amplifies a signal of varying amplitude in a first saturated power amplifier that operates from a fixed voltage power supply to produce a first output signal of constant amplitude. The signal of varying amplitude also is amplified in a second saturated power amplifier that operates from a modulated voltage power supply, to produce a second output signal of amplitude that depends on the signal of varying amplitude, a modulated power supply voltage, and on an invert/noninvert control signal. The first and second output signals are combined into a load. The modulated voltage power supply is modulated while generating the invert/noninvert control signal, such that the combined first and second output signals into the load amplify the signal of varying amplitude. The signal of varying amplitude also may be of varying amplitude and varying phase.

In another embodiment, the modulated voltage power supply may be modulated while generating the invert/noninvert control signal, to invert the second output signal relative to the signal of varying amplitude when an instantaneous amplitude of the signal of varying amplitude is less than an amplitude that is produced in the load by the first saturated amplifier, and to noninvert the second output signal relative to the signal of varying amplitude when the instantaneous amplitude of the signal is greater than the amplitude that is produced in the load by the first saturated amplifier, such that the combined first and second output signals into the load amplify the signal of varying amplitude. In another embodiment, the second saturated power amplifier uses bilateral amplification devices that draw current from a modulated voltage power supply and that supply current to the modulated voltage power supply. In contrast, the first saturated power amplifier draws current from the fixed voltage power supply and does not supply current to the fixed voltage power supply, to produce the first output signal of constant amplitude. In yet another embodiment, the second saturated power amplifier draws current from the modulated voltage power supply when the invert/noninvert control signal indicates noninvert and supplies current to the modulated voltage power supply when the invert/noninvert control signal indicates invert.

In yet another embodiment, the first and second output signals are combined into the load by serially combining the first and second output signals with the load. In a first embodiment, one of the first and second output signals is coupled directly to the load and the other of the first and second output signals is coupled to the load via an isolation transformer. In a second embodiment, the respective first and second output signals are coupled to the load via respective first and second quarter wave lines.

In another embodiment of the present invention, the output ports of two amplifiers may be connected in series with a common load, such as by connecting each amplifier via a quarter wave line to the same load terminal. In this embodiment, one of the amplifiers may be driven with a constant amplitude AC drive signal and powered from a constant voltage DC power supply, so that its output signal is a constant AC voltage and its contribution to the load current is a fixed AC load current proportional to the constant AC voltage. The second amplifier is driven to saturation by a drive signal of adequate drive level, which may be a constant drive level, and the amplifier DC power terminal is connected to a variable voltage produced by a high level modulator in response to an amplitude modulating signal. Moreover, the phase of the second amplifier's drive signal may be in-phase or 180° out-of-phase with the first amplifier's drive signal, depending on whether the second amplifier's contribution to the load signal is adding to (boost) or subtracting from (buck) the first amplifier's contribution.

In another embodiment, when the second amplifier is driven in the "buck" regime, current and power flow out of its DC power terminal and are preferably returned to the DC power source by means of a variable, switched mode power converter, such as a boost mode power converter used in reverse. Alternatively, when the second amplifier is driven in the "boost" regime, power is supplied from the DC power source to the amplifier power terminal via a suitable variable power converter such as a switch mode "buck" regulator. Thus, this embodiment may be configured as either a "buck only" Doherty amplifier, in which the first amplifier supplies the maximum power desired unless "bucked" by the second amplifier, or alternatively as a buck/boost amplifier in which the output signal may be varied both upwards and downwards from the first amplifier's output signal level by selecting either the buck drive phase or the boost drive phase for the second amplifier. The amplifier also may be configured as a "boost only" amplifier.

Embodiments of the present invention also may be used with signals of varying amplitude that have an in-phase (I) component and a quadrature-phase (Q) component. In these embodiments, the first and second saturated power amplifiers may amplify the in-phase component of the signal. A third and fourth saturated power amplifier may amplify the quadrature-phase component of the signal. The first, second, third and fourth output signals that are produced thereby may be combined into a load. First and second modulated voltage power supplies for the second and fourth saturated power amplifiers may be identical or may be independent of one another. Moreover, the first and third fixed voltage power supplies for the first and third saturated amplifiers may be identical or may be independent of one another.

In yet other embodiments of the present invention, a signal is amplified by generating a first input signal, a second input signal, an invert/noninvert signal and a variable power supply voltage from the signal. The first input signal is amplified using a fixed power supply voltage to produce a first output signal. The second input signal is selectively invertingly and noninvertingly amplified using the variable power supply voltage in response to the noninvert/invert control signal, to produce a second output signal. The first and second output signals are coupled into a load, to thereby amplify the signal. When selectively invertingly and noninvertingly amplifying the second input signal, current may be selectively drawn from the modulated voltage supply and supplied to the modulated voltage power supply. On the other hand, when amplifying the first input signal using the fixed power supply voltage, current may only be drawn from the fixed power supply voltage. The first and second output signals may be coupled to the load in the configurations that were described above. Moreover, in-phase and quadrature-phase components of the signal may be amplified separately and then combined as was described above.

In embodiments of the Parent Application and the CIP Application, two or more coupled amplifiers driven using outphasing modulation of Chireix can operate identically and symmetrically effect each other's effective load line, so as to efficiently generate both peak and trough power levels, thereby allowing power efficiency to be maintained over a wider dynamic range than in Doherty's amplifier. When the two amplifiers are not in-phase and effect each other's load line, the current flows from the DC source to the load during part of the signal waveform cycle, and to the source for another part of the cycle. This can reduce the mean power consumption from the source in the ratio that the load power is reduced, so to as allow high efficiency.

Unfortunately, the active devices in the power amplifiers may have nonlinearities. These nonlinearities may cause inaccurate production of the phase modulating signals. Embodiments of the present invention can reduce and may even eliminate the effect of these nonlinearities, by driving the amplifiers with only relative phasings of 0° or 180°.

Accordingly, embodiments of the present invention can provide RF transmitters that can efficiently produce a high power, modulated signal centered on a carrier frequency, the modulation having both amplitude- and/or phase-varying components that are determined respectively by an amplitude-representative modulating signal and a phase-modulating signal. Embodiments of the invention may be used to produce variable output power levels from a transmitter, with substantially higher efficiency at reduced power levels.

In one embodiment of the present invention, the output ports of two amplifiers are equivalently connected in series with a common load, such as by connecting each amplifier via its own quarter-wave line to the same load terminal. In this embodiment, one of the amplifiers may be driven with a constant amplitude AC drive signal and powered from a constant-voltage DC power supply so that its output signal at the amplifier output is a constant AC voltage and its contribution to the load current is a fixed AC load current proportional to the constant AC voltage. The second amplifier is driven to saturation by a drive signal of adequate drive level, which may be a constant drive level, and the amplifier DC power terminal is connected to a variable voltage produced by a high-level modulator in response to an amplitude modulating signal. Moreover, the phase of the second amplifier's drive signal may be in-phase or 180 degrees out-of-phase with the first amplifier's drive signal depending on whether the second amplifier's contribution to the load signal is used to add to (boost) or subtract from (buck) the first amplifier's contribution. When the second amplifier is driven in the "buck" regime, current and power preferably flows out of its DC power terminal and is preferably returned to the DC power source, for example by a suitable variable, switched-mode power converter, such as a boost mode power converter used in reverse. Alternatively when the second amplifier is driven in the "boost" regime, power is supplied from the DC power source to the amplifier power terminal via a suitable variable power converter such as a switched-mode "buck" regulator.

This embodiment may be configured as either a "buck-only" Doherty amplifier, in which the first amplifier supplies the maximum power required unless "bucked" by the second amplifier, or alternatively as a buck-boost amplifier in which the output signal may be varied both upwards and downwards from the first amplifier's output signal level by selecting either the buck drive phase or the boost drive phase for the second amplifier. The amplifier may also be configured as a "boost-only" amplifier.

In second embodiments of the invention, both the first and the second amplifiers may be modulated in amplitude using a high-level modulation of their respective power supplies. The first amplifier may be modulated from zero to a maximum output level while the second amplifier is held at zero supply voltage, contributing nothing to the output signal at the common load. Higher outputs than the first amplifier alone can supply are then obtainable by holding the first amplifier supply voltage constant at the maximum level while the second amplifier is modulated from zero to its maximum contribution, thus doubling (for example) the load signal current and quadrupling the load power relative to the first amplifier alone.

In both the first and second embodiments, phase modulation may be obtained simultaneously with amplitude modulation by phase modulating the drive signals to the first and second amplifier, for example using the same phase-modulating signal. In third embodiments, more than two amplifiers may be equivalently connected in series with a common load impedance, for example by parallel connection via quarter-wave lines. One embodiment uses four amplifiers, of which one pair produces an amplitude-modulated cosine-wave contribution to the load signal current and the other pair produces an independently amplitude modulated sine-wave contribution to the load current, thereby producing an arbitrary, complex-modulated output signal into the common load.

A switched-mode power circuit may be used to control the flow of power from a DC source to a load with variable voltage buck and to control the flow of power backwards from the load to the DC power source with variable voltage boost, as may be desired for constructing a buck-boost Doherty amplifier for any of the above embodiments.

Figure 14:
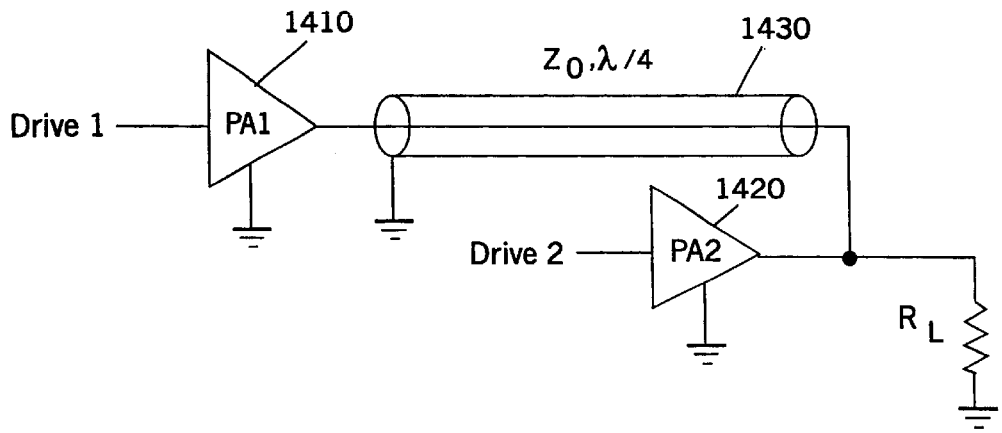
FIG. 14 is a block diagram of a conventional Doherty amplifier.

A conventional Doherty amplifier is shown diagrammatically in FIG. 14. A first class-B power amplifier 1410 is driven with a drive signal DRIVE 1 to create power levels between zero and Pmax/4 into the load $R_L$. For power levels higher than Pmax/4, the first power amplifier 1410 is allowed to saturate while a second power amplifier 1420, connected one quarter wavelength away from the first power amplifier 1410 towards the load by a quarter wave line 1430, is driven with a drive signal DRIVE 2. The second power amplifier 1420 is a current source, contributing its current to the load $R_L$ and raising the output voltage. Due to the property of the quarter-wave line that the current into the left hand side is proportional to the voltage out from the right hand side into the load, this results in a higher current flowing from the first amplifier too, which can raise its saturated output level while its efficiency can stay constant at the theoretical 78.5% value for a saturated class-B amplifier.

Thus, a conventional Doherty amplifier can exhibit an efficiency that rises from zero % at zero output power to 78.5% at an output of Pmax/4, and then remains substantially constant up to a maximum output of Pmax when both the first and second amplifiers 1410 and 1420 are saturated. With a conventional Doherty amplifier, it generally is not efficient to attempt to use the second amplifier 1420 to "buck" the output of the first amplifier, as driving the second amplifier out-of-phase with the first amplifier generally results in the active devices passing current when the voltage across them was high, giving unwanted power loss by heat dissipation. The Doherty amplifier may also present design challenges in creating two amplitude modulated drive signals DRIVE 1 and DRIVE 2 such that the combined amplitude in load $R_L$ linearly follows a desired waveform.

FIG. 3 above shows a pair of amplifiers 312, 314 series coupled at their outputs according to the Parent Application. Transformers 322, 324 are illustrated to facilitate the series coupling of outputs that are relative to ground. The series coupling can ensure that the same current, equal to the load current, flows in the output circuits 316, 318 of both amplifiers 312, 314. When coupling only two amplifiers in series, only one transformer may be needed to isolate the output of one amplifier, as its secondary may be coupled directly to the output of the other amplifier and to the load.

Series connection at microwave frequencies also may be achieved by parallel connection a quarter wave distant, using two quarter wave lines as shown in FIG. 4. When the outputs of the two quarter wave lines 422, 424 are paralleled as in FIG. 4 the output voltages may be forced to be the same (Vo) at the junction 440. This can force the currents I1, I2 to be the same quarter-wave away at the PAs, if the lines are of equal impedance, creating the same conditions as in the series connection of FIG. 3. If the lines are of different impedance 201, 202, the PA output currents may be forced to be in the inverse ratio of the impedances.

The PAs 312, 314 each ideally generate an output swing of Vcc at their ends of their quarter wave lines 422, 424 when, as in FIG. 4, they are powered by equal supply voltages. Since the voltages are the same at that end, the currents at the other ends one quarter wave away generally are equal with equal line impedances. With unequal line impedances, the currents will be respectively Vcc/Zo1 and Vcc/Zo2 at the junction of the lines. The total output current is thus $$Io=Vcc\ (1/Zo1+1/Zo2),\ or\ 2Vcc/Zo\ for\ equal\ lines$$

if the amplifiers 312, 314 are driven in phase. Alternatively, if the amplifiers are driven 180 degrees out-of-phase, the output current in the load is given by:

$$Io=Vcc\ (1/Zo1-1/Zo2),\ or\ zero\ for\ equal\ lines.$$

Thus, output signal amplitudes between zero and 2Vcc/Zo may be produced by selecting the relative drive phasing to be 0 degrees for amplitudes greater than Vcc/Zo1 and 180 degrees for amplitudes less than Vcc/Zo1. It may be impractical, however, to produce specific values of output amplitude by modulating the line impedance Zo2. Instead, in first embodiments of the present invention a first amplifier is powered from a fixed power supply voltage of Vcc1 while a second power amplifier is powered using a variable supply voltage Vcc2.

Then, the expression for the load current is:

$$Io=Vcc1/Zo1+/-Vcc2/Zo2,\ or\ (Vcc1+/-Vcc2)/Zo\ for\ equal\ line\ impedances.$$

Thus, by modulating Vcc2 between 0 and Vcc1 and choosing the plus or minus sign, output signal current amplitudes between 0 and 2Vcc1/Zo can be achieved.

Figure 15:
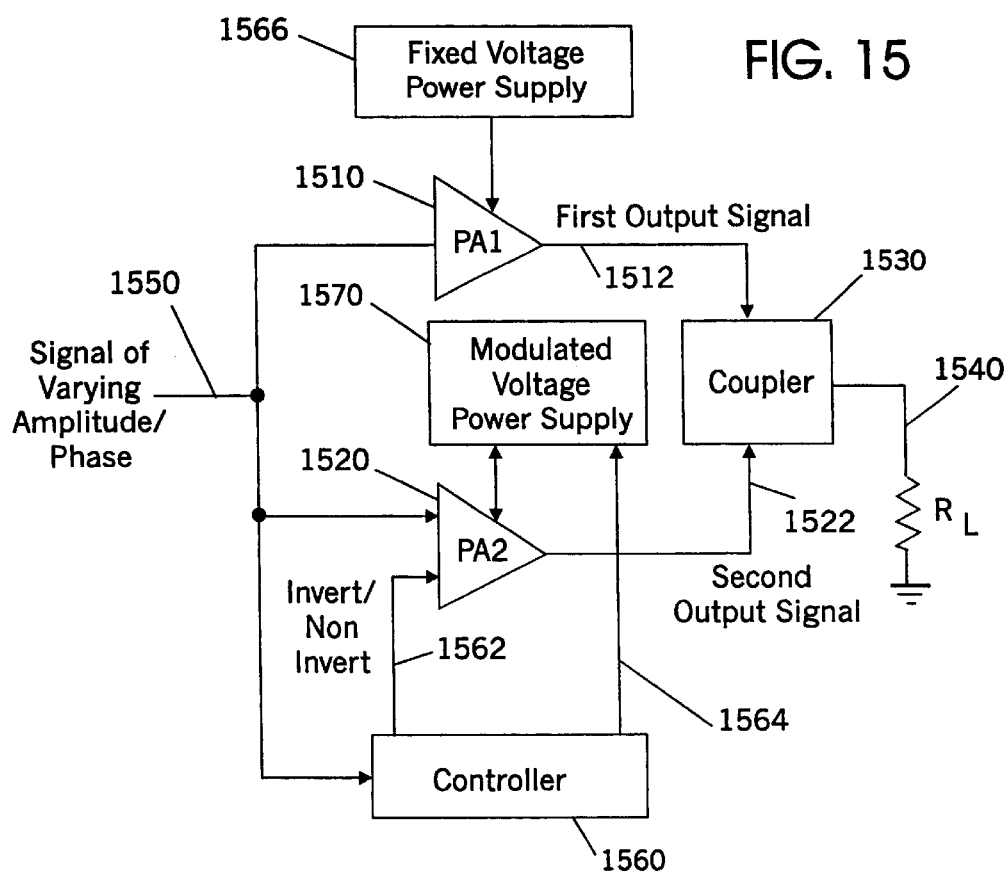
FIG. 15 is a block diagram of embodiments of systems and methods for amplifying a signal of varying amplitude according to the present invention.

FIG. 15 is a block diagram of systems and methods for amplifying a signal of varying amplitude according to embodiments of the present invention. As shown, these systems and methods include a fixed voltage power supply 1566 and a modulated voltage power supply 1570. A first saturated power amplifier 1510 is responsive to a signal of varying amplitude 1550, and is powered by the fixed voltage power supply 1566, to produce a first output signal 1512 of constant amplitude. A second saturated power amplifier 1520 is responsive to the signal of varying amplitude 1550 and to an invert/noninvert control signal 1562, and is powered by the modulated voltage power supply 1570, to produce a second output signal 1522 of amplitude that depends on the signal of varying amplitude 1550, the modulated power supply voltage 1564 and on the invert/noninvert control signal 1562. A coupler 1530 couples the first and second output signals to a load 1540, for example using any of the coupling techniques that were described above. A controller 1560 modulates the modulated voltage power supply 1570 while generating the invert/noninvert control signal 1562. It will be understood that the signal of varying amplitude may be of varying amplitude and/or of varying phase.

As illustrated in FIG. 15, the controller modulates the modulated voltage power supply 1570 using the modulation signal 1564, while generating the invert/noninvert control signal 1562, to invert the second output signal 1522 relative to the signal of varying amplitude 1550 when the instantaneous amplitude of the signal of varying amplitude 1550 is less than the amplitude that is produced in the load 1540 by the first saturated amplifier 1510, and to noninvert the second output signal 1522 relative to the signal of varying amplitude 1550 when the instantaneous amplitude of the signal of varying amplitude 1550 is greater than the amplitude that is produced in the load by the first saturated power amplifier 1510. Moreover, in one embodiment, as was described above, the second saturated power amplifier 1520 comprises bilateral amplification devices that draw current from the modulated voltage power supply 1570 and also supply current to the modulated voltage power supply 1570. Accordingly, a bidirectional arrow is shown between modulated voltage power supply 1570 and the second power amplifier 1520. In contrast, the first power amplifier 1510 draws current from the fixed voltage power supply 1566 and does not supply current to the fixed voltage power supply 1566. A unidirectional arrow therefore is shown. More specifically, the second saturated power amplifier 1520 preferably draws current from the modulated voltage power supply 1570 when the invert/noninvert control signal 1562 indicates noninvert, and supplies current to the modulated voltage power supply when the invert/noninvert control signal indicates invert.

It will be understood that there may be many ways to invert the second output signal 1522 in response to the invert/noninvert control signal 1562. For example, the input connections to the second power amplifier 1520 may be reversed. Alternatively, the connections between a one or an odd number of internal stages of the second power amplifier 1520 may be reversed. Reversal of connections may be performed mechanically, electronically and/or electromechanically. In yet another alternative, a second buffer amplifier may be provided that selectively inverts the signal of varying amplitude 1550 that is applied to the second power amplifier 1520.

Figure 16:
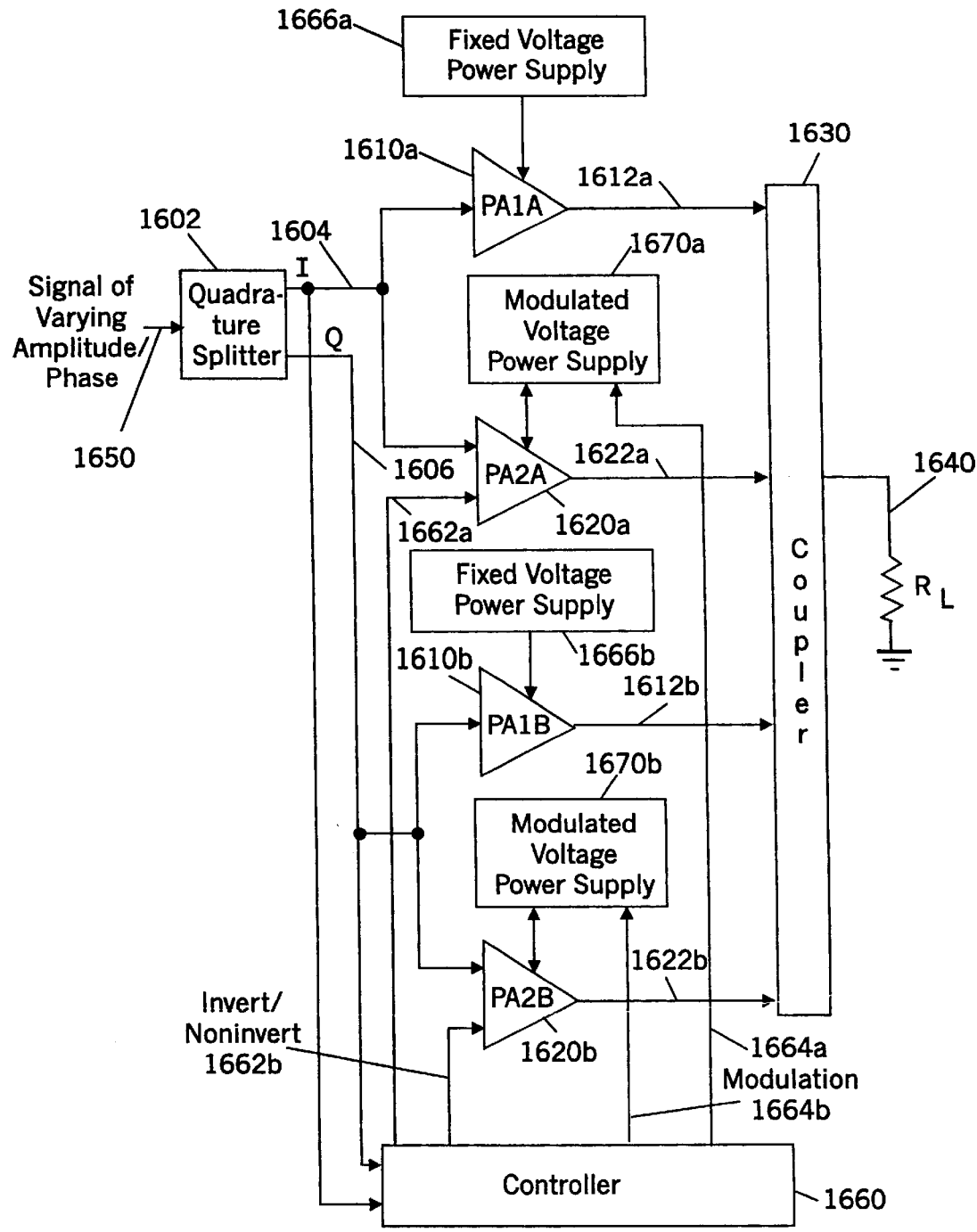
FIG. 16 is a block diagram of other embodiments of amplifying systems and methods according to the present invention, wherein separate in-phase and quadrature-phase paths may be provided.

FIG. 16 is a block diagram of other embodiments of amplifying systems and methods according to the present invention, wherein separate in-phase (I) and quadrature-phase (Q) paths may be provided. A quadrature splitter 1602 may be used to provide in-phase and quadrature input signals 1604 and 1606, respectively, from the signal of varying amplitude 1650. Then, the first saturated power amplifier 1610a is responsive to the in-phase component 1604 of the signal of varying amplitude 1650 and is powered by a first fixed voltage power supply 1666a, to produce the first output signal 1612a of constant amplitude. The second saturated power amplifier 1620a is responsive to the in-phase component 1604 of the signal varying amplitude 1650 and to a first invert/noninvert signal 1662a, and is powered by a first modulated voltage power supply 1670a, to produce the second output signal 1622*a* of amplitude that depends on the in-phase component 1604 of the signal of varying amplitude 1650, the modulated power supply voltage 1670*a*, and on the first invert/noninvert control signal 1662*a*.

Third and fourth saturated power amplifiers 1610*b* and 1620*b* also are provided, that are responsive to the quadrature-phase component 1606 of the signal varying amplitude 1650. The third saturated power amplifier 1610*b* is powered by a second fixed voltage power supply 1666*b*, which may the same as the first fixed voltage power supply 1666*a*, to produce a third output signal 1612*b* of constant amplitude. The fourth saturated power amplifier 1620*b* is responsive to the quadrature-phase component 1606, and is powered by a second modulated power supply 1670*b*, to produce a fourth output signal 1622*b* of amplitude that depends on the quadrature-phase component 1606, the second modulated power supply voltage 1670*b* and a second invert/noninvert control signal 1662*b*. It will be understood that the second modulated voltage power supply 1670*b* generally is different from the first modulated voltage power supply 1670*a*, and the first and second invert/noninvert control signal 1662*a* and 1662*b* also generally are different. However, they may be identical. The coupler 1630 couples the first, second, third and fourth output signals 1612*a*, 1622*a*, 1612*b* and 1622*b* to a load 1640. A controller 1660 modulates the first and second modulated voltage power supplies 1670*a* and 1670*b* using modulation signals 1664*a* and 1664*b*, respectively, while generating the first and second invert/noninvert control signals 1662*a*, 1662*b*, such that the combined first, second, third and fourth output signals into the load 1640 amplify the signal of varying amplitude.

Figure 17:
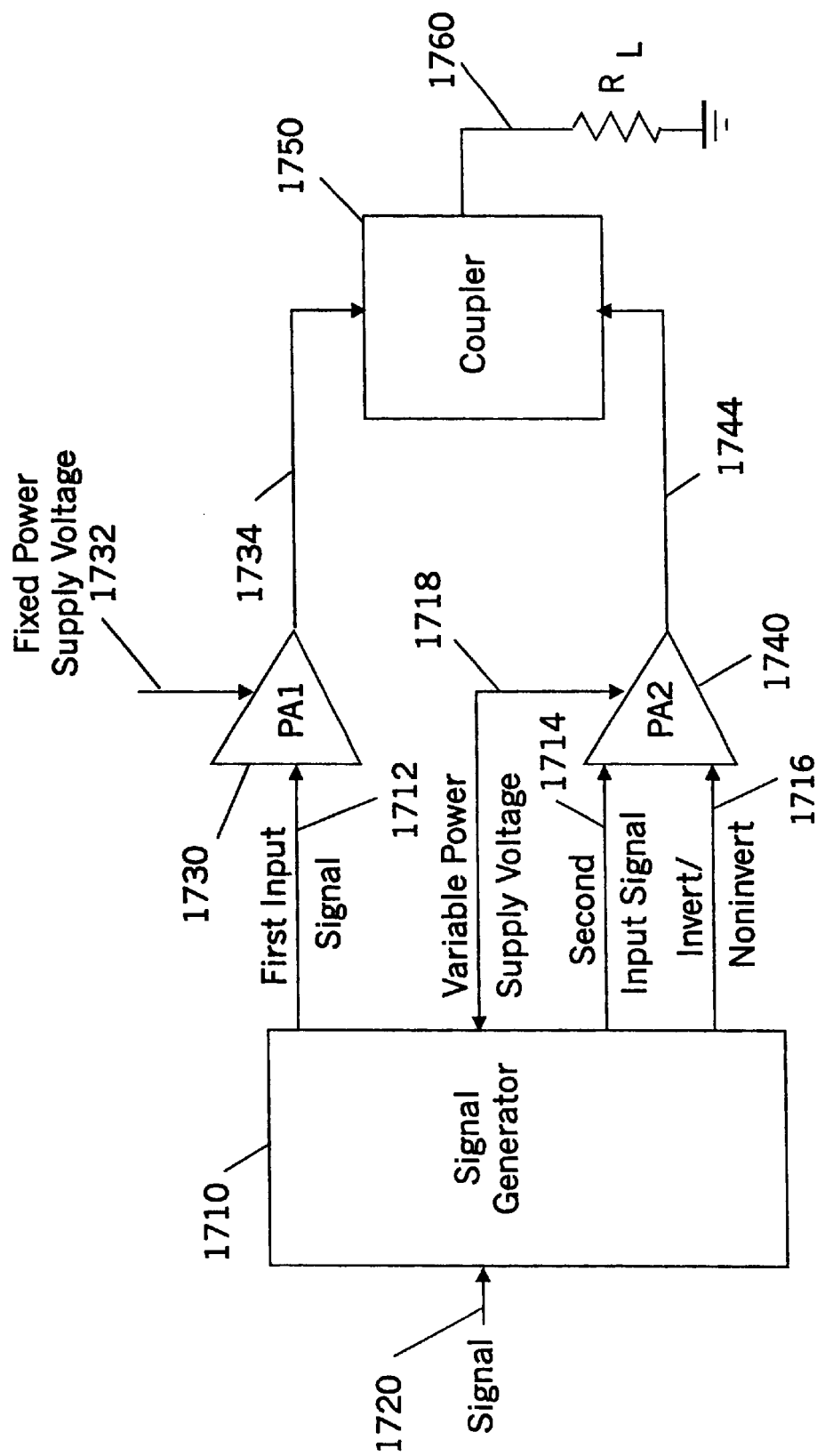
FIG. 17 is a block diagram of yet other embodiments of systems and methods for amplifying signals according to the present invention.

FIG. 17 is a block diagram of systems and methods for amplifying signals according to yet other embodiments of the present invention. As shown in FIG. 17, a signal generator 1710 generates a first input signal 1712, a second input signal 1714, an invert/noninvert control signal 1716 and a variable power supply voltage 1718 from a signal 1720. A first power amplifier 1730 amplifies the first input signal 1712 using a fixed power supply voltage 1732, to produce the first output signal 1734. A second power amplifier 1740 selectively invertingly and noninvertingly amplifies the second input signal 1714, using the variable power supply voltage 1718, in response to the invert/noninvert control signal 1716, to produce a second output signal 1744. A coupler 1750 couples the first and second output signals 1734 and 1744 into a load 1760, to thereby amplify the signal 1720. As was described above, the second power amplifier 1740 preferably selectively draws current from the variable power supply 1718 and selectively supplies current to the variable power supply voltage 1718. In contrast, the first power amplifier 1730 preferably draws current from the fixed power supply voltage 1732, but does not supply current to the fixed power supply voltage. The coupler may be provided as was described in detail above.

Figure 18:
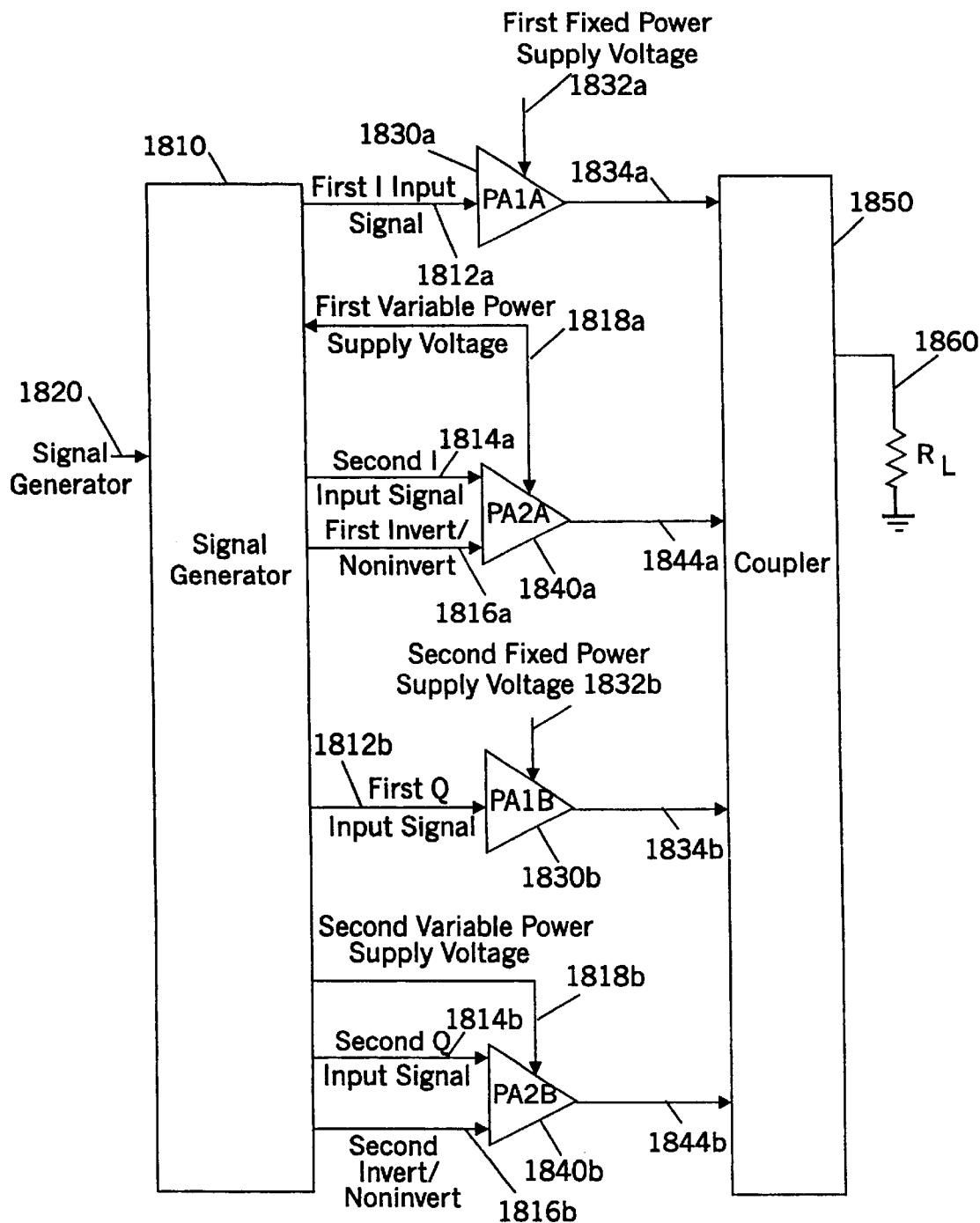
FIG. 18 is a block diagram of other embodiments of the present invention, wherein in-phase and quadrature-phase components of a signal may be separately amplified and then combined.

FIG. 18 is a block diagram of yet other embodiments of the present invention, wherein in-phase and quadrature-phase components of a signal may be separately amplified and then combined.

In particular, as shown in FIG. 18, a signal generator 1810 generates from a signal 1820, a first in-phase (I) input signal 1812*a*, a second in-phase input signal 1814*a* (which may or may not be identical), a first quadrature-phase (Q) input signal 1812*b* and a second quadrature input signal 1814*b* (which may or may not be identical), a first variable power supply voltage 1818*a*, and a second variable power supply voltage 1818*b* (which may or may not be identical) and a first invert/noninvert signal 1816*a* and a second invert/noninvert signal 1816*b* (which may or may not be identical). A first in-phase power amplifier 1830*a* and a second in-phase power amplifier 1830*b* operate from a first fixed power supply voltage 1832*a* and a second fixed power supply voltage 1832*b*, which may or may not be identical. A third quadrature-phase power amplifier 1840*a* and a fourth quadrature-phase power amplifier 1840*b* operate from the first and second variable power supply voltages 1818*a* and 1818*b* respectively. The outputs 1834*a*, 1844*a*, 1834*b* and 1844*b* of all four power amplifiers are coupled via coupler 1850 into a load 1860. It will be understood by those having skill in the art that the signal generator 1810 may include separate in-phase and quadrature-phase signal generators that are preceded by a quadrature splitter. Moreover, separate signal generators may be used to provide the combinations of the signals that are applied to the power amplifiers.

Figure 19:
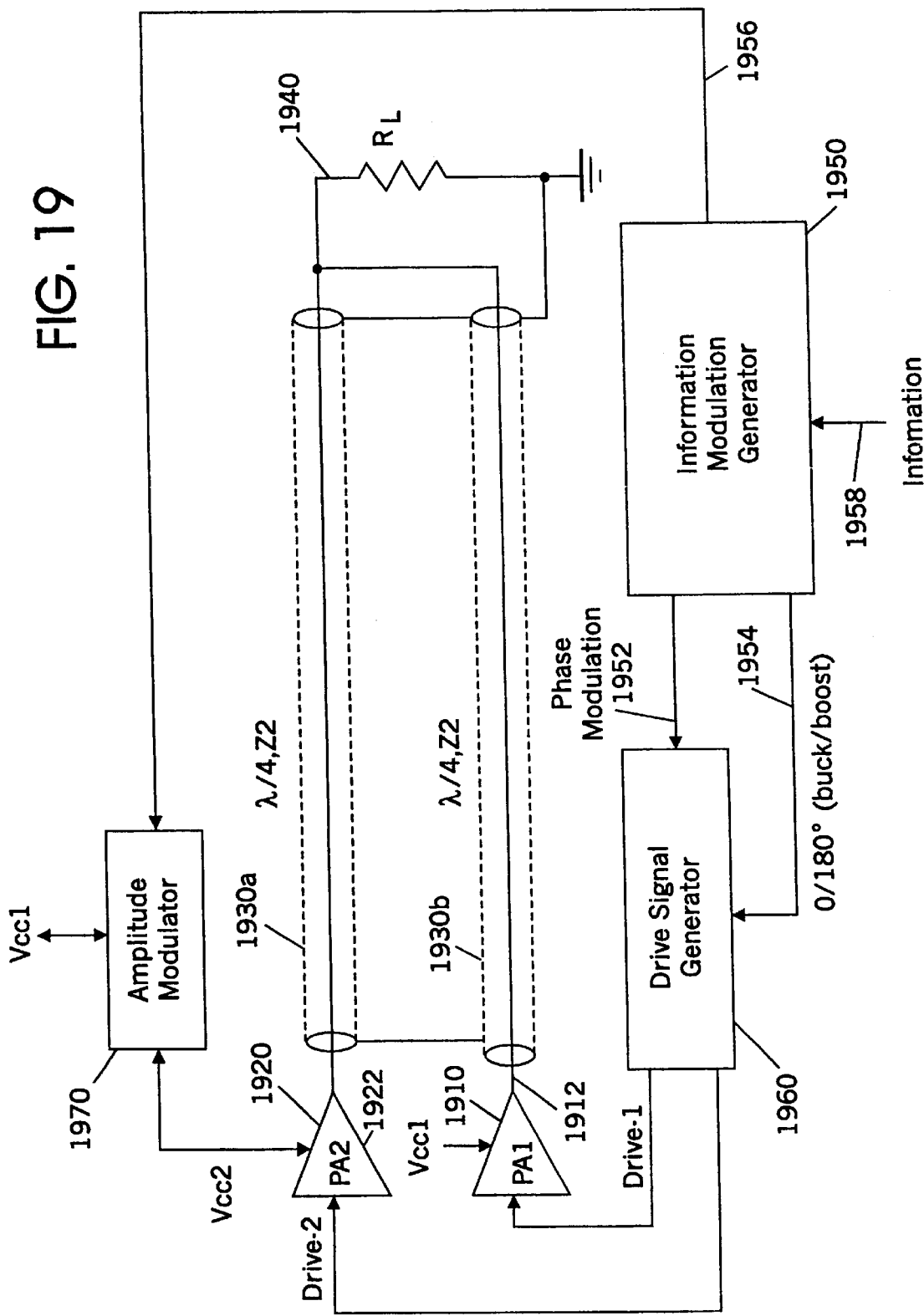
FIG. 19 is a block diagram of yet other embodiments of systems and methods for amplifying a signal according to the present invention.

FIG. 19 is a block diagram of yet other embodiments of systems and methods for amplifying a signal according to the present invention, and may be contrasted with a conventional Doherty amplifier that was illustrated in FIG. 14. Embodiments of FIG. 19 can alleviate the above-mentioned disadvantages of the Doherty amplifier.

In FIG. 19, instead of the second (boost) amplifier of the Doherty configuration being a current source (i.e. unsaturated) connected directly to the end of the quarter wave line joining the first amplifier to the load, the second amplifier 1920 of FIG. 19 is a saturated amplifier (a voltage source) and is connected via a second quarter wave line 1930*a* to the junction of the first quarter wave line and the load 1940. In this respect the amplifier coupling configuration can be the same as disclosed in the Parent Application. In the Parent Application however, it was proposed to vary the amplitude of the load signal by continuously varying the relative phases of the drive signals DRIVE 1 and DRIVE 2 to the respective amplifiers 1910 and 1920 between in-phase, giving addition, and out-of-phase, giving cancellation.

In contrast, in embodiments of the present invention, the relative phase of the signals DRIVE 1 and DRIVE 2 to the respective amplifiers 1910 and 1920 is not continuously varied, but is either 0 or 180 degrees depending on whether addition or subtraction of the output signal 1922 from amplifier signal 1920 to the output signal 1912 from power amplifier 1910 is desired. The output signal to the load 1940 may be varied continuously by varying the amplitude of the signal voltage 1922 from amplifier 1920 using a high-level amplitude modulator 1970. The high-level amplitude modulator 1970 connects to the prime power supply, which may be a battery in a handheld cellular phone, for example at a fixed voltage Vcc1 such as 3 volts nominal. The amplitude modulator 1970 then regulates the voltage at which it connects to PA2 1920 to a different value Vcc2, which may be varied to produce a desired amplitude modulation of the output signal 1922 to the load 1940.

The drive signal generator 1960 produces a drive signal DRIVE 1 modulated in phase angle with the desired phase modulation of a composite amplitude/phase modulation that is desired. DRIVE 2 is the same as DRIVE 1 except that it may follow DRIVE 1 in phase or with a 180° phase difference depending on whether addition or subtraction of the outputs of PA1 and PA2 is desired. Information modulation generator 1950 generates a phase modulation signal 1952, a 0/180° signal 1954, also referred to as a buck/boost or invert/noninvert signal, and an amplitude modulation signal 1956, from an information signal 1958 to be amplified.

If the desired signal modulation comprises amplitude modulation all the way down to zero output amplitude into the load 1940, then the power amplifiers PA1 1910 and PA2 1920 and the quarter-wave line impedances Z1 and Z2 preferably are identical. Sometimes filtered digital modulations are encountered that do not need modulation down to zero, but to say −10 dB or 0.3 of the mean amplitude. This can be achieved by making Z2 1.4 times Z1, so that power amplifier 1920 contributes a subtractive current that is 70% of power amplifier 1910 contribution, giving an amplitude trough of 0.3 times the mean. The peak amplitude would then be 1.7, or roughly 5 dB above the mean. A peak to mean ratio of 5 dB or less is also typical of such linear digital modulations.

Such a modulation also can be produced with equal Z1 and Z2 and identical power amplifiers by just not fully utilizing the full range of amplitude modulation available of zero to twice the mean amplitude. Such signals could also be amplified using embodiments of the invention with only upward (i.e. boost) modulation, by setting the first amplifier's relative contribution to the output current to 0.3 and allowing the second amplifier to contribute a relative amount varying between 0 and 1.4 (if the peak is 1.7 times the mean). Any other split of the relative contributions of the two amplifiers may also be chosen, and an optimum may exist in practice that optimizes the practically achieved efficiency for a given signal amplitude probability distribution function. This can be determined by computer simulations in which the main sources of loss of efficiency are modeled.

Figure 20:
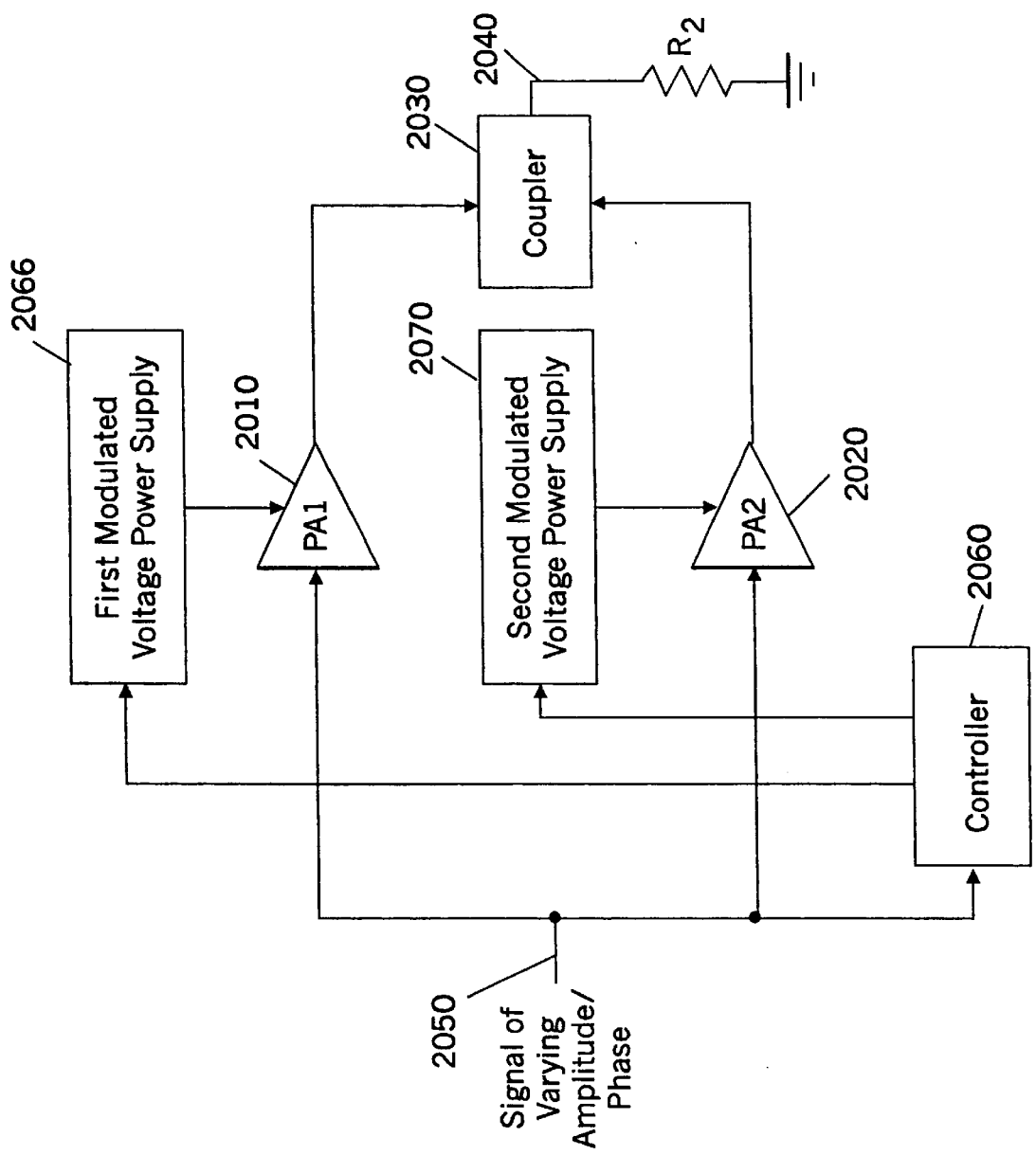
FIG. 20 is a block diagram of still other embodiments of systems and methods for amplifying the signal according to the present invention.

Referring now to FIG. 20, in other embodiments of the invention, both the first and second power amplifiers 2010 and 2020 may be modulated in amplitude using first and second modulated voltage power supplies 2066 and 2070, respectively. The first power amplifier 2010 may be modulated from zero to a maximum output power level while the second amplifier 2020 is held at zero supply voltage, so that it need not contribute to the output signal at the common load 2040 through the coupler 2030. Higher outputs than the first amplifier 2010 alone can supply are then obtainable by holding the first amplifier supply voltage 2066 constant at the maximum level, while the second amplifier 2020 is modulated from zero to its maximum contribution by the second modulated voltage power supply 2070, thus doubling (for example) the load current and quadrupling (for example) the load power relative to the first amplifier alone. A controller 2060 can control the operation of the first and second voltage power supplies in response to the signal of varying amplitude and/or phase 2050. Embodiments that separately amplify in-phase and quadrature-phase components of the signal 2050 also may be provided in a manner described, for example, in FIG. 16. A signal generator also may interface with the signal of varying amplitude/phase 2050, to generate the signals that control the first and second modulated voltage power supplies 2066 and 2060, and also to generate input signals for the first and second power amplifiers 2010 and 2020, as was described in FIG. 17.

In contrast with embodiments of the Parent Application, the first amplifier can be arranged never to operate as a synchronous rectifier, returning current to the supply. Only the second amplifier need have this capability in order to achieve the highest efficiency. Thus, in embodiments of the present invention, the first amplifier may be constructed using non-bilateral devices such as gallium arsenide Heterojunction Bipolar Transistors (HBTs) while the second amplifier preferably is constructed from symmetrical bilateral devices such as insulated gate field effect transistors (FETs).

It is known to provide polar modulation in which a single amplifier may be simultaneously amplitude and phase modulated to produce any complex modulation. However, conventionally, the amplitude modulator handled the full, peak power output. In contrast, in embodiments of the present invention, the amplitude modulator need only handle half the peak power output. Thus, losses in the amplitude modulator need not cause so much efficiency loss when using the present invention. Even when using a dissipative regulator (such as an emitter follower) as an amplitude modulator 1970, embodiments of the present invention may be advantageous in that the power amplifier 1910 can operate at the full supply voltage when generating the mean output amplitude level, while a conventional polar modulator may operate its single power amplifier at half the supply voltage to generate the mean amplitude level. Since it may be easier to construct high efficiency amplifiers with higher supply voltages, embodiments of the invention may be equivalent to doubling the supply voltage, allowing higher efficiencies to be achieved.

When the buck regime is selected to obtain a load current less than Vcc1/Zo, the second amplifier 1920 generally is driven in antiphase. Thus, although the output signal 1930a is still positive, the switching of the amplifier devices is in the reverse phase relationship to the output current, resulting in the output devices acting as synchronous rectifiers instead of amplifying devices. In this regime, the second amplifier can become a source of rectified DC power rather than consuming DC power, as is explained in the Parent Application. One difference from the Parent Application however is that the amplifiers can operate either in the amplifying regime or in the synchronous rectifier regime over the whole of an RF cycle, instead of both consuming DC current from and returning DC current to the DC source in the same RF cycle.

In the buck regime, it may be desired to return power from the instantaneous voltage on the second amplifier of Vcc2 to the principal supply of Vcc 1, which may use a boost converter operating in reverse, since Vcc2<Vcc1. Alternatively, when the positive sign is selected to obtain a load current greater than Vcc1/Zo, the second amplifier is driven in phase with the first. In this regime, the second amplifier contributes power to the load and consumes power at a voltage of Vcc2, which can be derived from the prime power source of voltage Vcc1 by a buck regulator operating in the normal (forward) direction. To obtain a continuous amplitude modulation, a power converter circuit is desired for amplitude modulator 1970 that can be continuously modulated from forward buck through reverse boost.

Preferred embodiments of an amplitude modulator 1970 should be "lossless" switching-mode type, and should be able to transfer power from the supply at Vcc1 to PA2 at Vcc2 in the amplifier boost mode (converter forward buck mode), or conversely to transfer power from PA2 at Vcc2 to the supply at Vcc1 in the amplifier buck mode (converter reverse boost mode). FIG. 21C is a circuit diagram of embodiments of amplitude modulators according to the present invention, and will be referred to as "forward buck or reverse boost regulators". Operation thereof will be described by first referring to FIG. 21A, which shows a forward buck regulator.

Figure 21A:
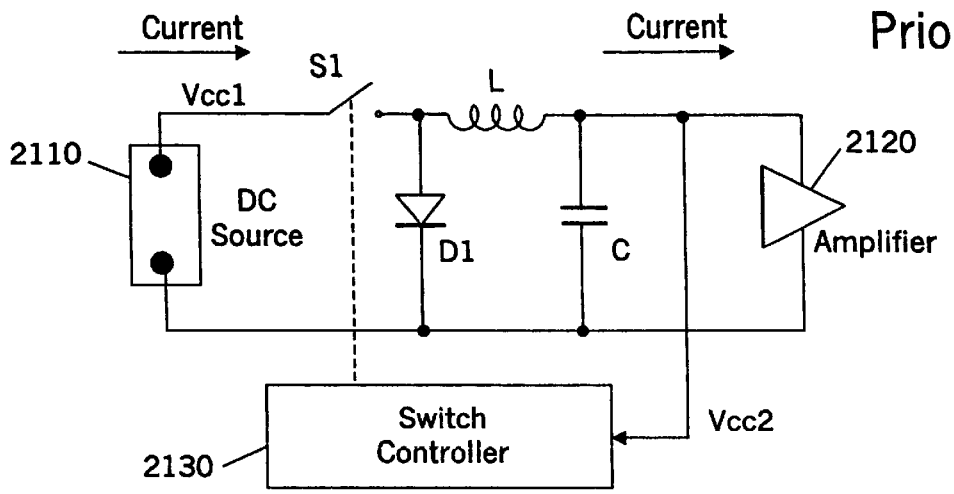
FIG. 21A is a circuit diagram of a conventional forward buck regulator.

In FIG. 21A, a DC source 2110 is fed through a switch S1 to a low-pass filter composed of inductor L and capacitor C, which filters out the switching frequency of switch S1. Switch S1 is controlled by controller 2130 to be closed for a fraction Vcc2/Vcc1 of the time, thereby reducing the average voltage from the Vcc1 of the source to Vcc2 at the amplifier. By varying the duty factor, switch controller 2130 can therefore modulate the supply voltage Vcc2 for amplifier 2120. In FIG. 21A, a catching diode D1 is employed to "catch" the flyback voltage of inductor L when the switch S1 is suddenly opened.

The current in an inductor does not reduce to zero immediately and therefore the voltage on D1 flies negatively until D1 clamps it just below ground potential. The current for the remainder of the switching cycle flows from ground potential. The current I flows from the source for a fraction Vcc2/Vcc1 of the time at the source voltage of Vcc2. The average power supplied by the source 2110 is thus (Vcc2/Vcc1) ×Vcc1×I=Vcc2×I. The current I flows continuously into the amplifier 2120 at a voltage of Vcc2, so the power consumed is Vcc2×I, equal to the power delivered by the source. The efficiency of conversion from voltage Vcc1 to voltage Vcc2 is thus 100% when losses such as the diode drop of D1 are neglected. The switch controller 2130 preferably senses the voltage Vcc2 at the amplifier and controls the switch on/off ratio to achieve the desired value, thereby forming a feedback control system.

Figure 21B:
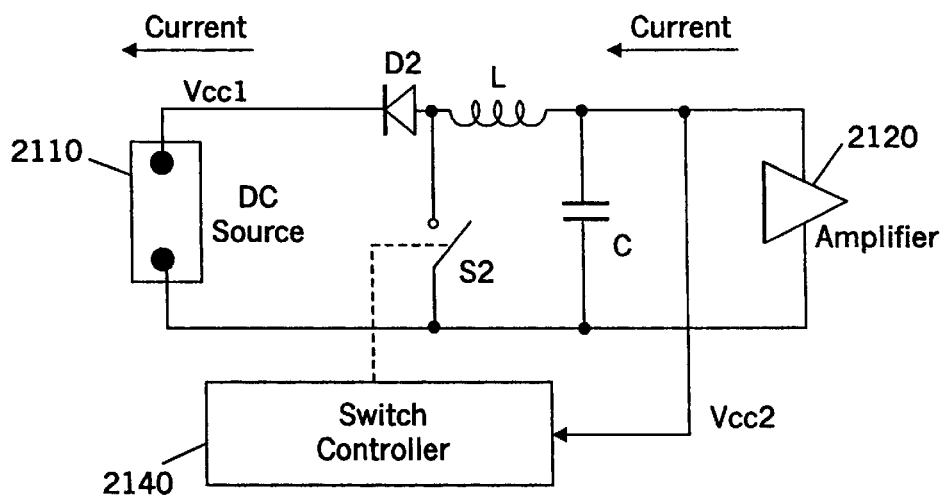
FIG. 21B is a circuit diagram of embodiments of reverse boost regulators according to the present invention.
Figure 21C:
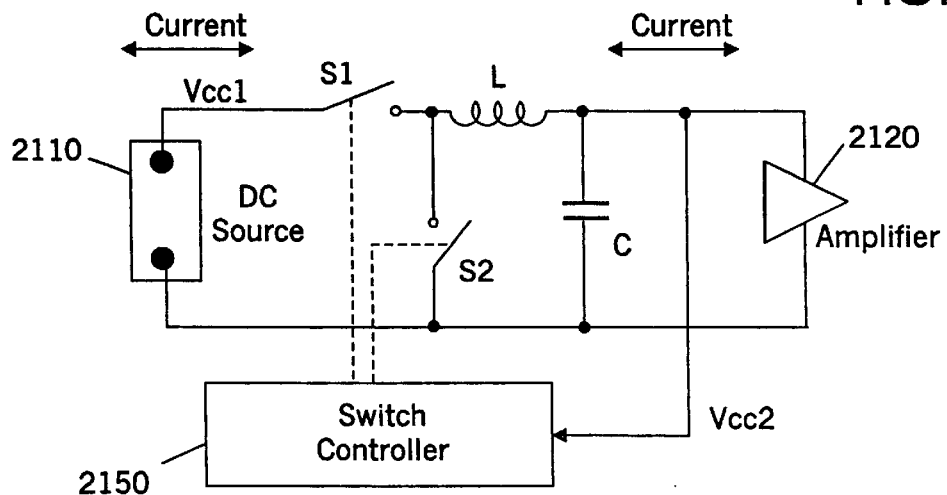
FIG. 21C is a circuit diagram of embodiments of forward buck or reverse boost regulators according to the present invention.

In FIG. 21B, according to embodiments of the present invention, the amplifier 2120 is now a source rather than a sink of power, as it is being used to "buck" the power output of another amplifier. Current therefore flows backwards from the amplifier 2120 at a controlled voltage of Vcc2 and it is desired to convert the power Vcc2×I to the source voltage Vcc1, which is higher Vcc2, and a current of I×(Vcc2/Vcc1) assuming no losses. This is achieved by closing switch S2 so that current from the amplifier 2120 builds up in inductor L. When switch S2 is then opened, the flyback is positive and is caught by D2, transferring the energy back to DC source 2110. Controller 2140 regulates Vcc2 by increasing the proportion of the time switch S2 is closed if Vcc2 is too high, or reducing the proportion of the time S2 is closed if Vcc2 is too low, thus forming a feedback control system for a reverse boost regulator. In principle such a boost regulator functions down to almost zero Vcc2 from amplifier 2120 when low voltage-drop FET switches are used for S2.

In systems using low values of Vcc1, such as the 3 volts nominally obtained from a single, rechargeable lithium cell, the 0.6 volt diode drop in D1 or D2 would represent a significant power loss. It is known in the art that D1 may be advantageously replaced by another switch that is closed by a controller 2140 at the instant D1 should conduct, i.e. at the same instant that S1 is opened.

This is shown in FIG. 21C, which may be recognized to be a combination of FIGS. 21A and 21B, where switch S2 has replaced D1 of FIG. 21A and S1 has replaced D2 of FIG. 21B. Thus, by suitably controlling S1 and S2 in FIG. 21C, controller 2150 can cause the circuit to operate either as a forward buck regulator or as a reverse boost regulator, exactly as desired for embodiments of the present invention. In contrast with prior art, however, the reverse boost regulator controller of FIGS. 21B and 21C operate to control the SOURCE voltage Vcc2, rather than the load voltage Vcc1.

Returning to FIG. 19, information 1958 to be modulated on to a radio transmission is converted in information modulator 1950 to a phase modulation 1952 to be impressed on drive signals DRIVE 1 and DRIVE 2 alike, and also a relative phase indication of 0 or 180 degrees. Drive signal generator 1960, which may include a modulatable fractional-N synthesizer, and/or a modulatable Direct Digital Synthesizer (DDS), applies the desired phase modulation to a selected radio carrier frequency and outputs the modulated signal as DRIVE 1, and outputs DRIVE 2 as either an inverted or non-inverted copy of DRIVE 1 according to whether the indicated relative phase is 180 degrees or 0 degrees. Information modulator 1950 also generates the amplitude modulating signal 1956 as |A-Amean| where A is the desired instantaneous amplitude and Amean is the mean amplitude level. Moreover the 0/180 degree indication 1954 is given by SIGN(A-Amean) so that 0 degrees is indicated when A>Amean and 180 degrees otherwise.

If the information modulation is generated by first generating I,Q signals (i.e. a Cartesian representation in the complex plane), then $A=\sqrt{I^2+Q^2}$ and the instantaneous phase modulation is given by $\phi$=ARCTAN(I,Q). It is known that the polar components (A,$\phi$) exhibit a greater bandwidth than the Cartesian components, so it may be desired, when using sampling, to represent A and $\phi$ by a higher sample rate than when using Cartesian (I,Q) modulators. Typically, the sampling rate may need to be at least three times the Nyquist rate of the I,Q signal bandwidths so that the sampled A and $\phi$ signals can be converted back to continuous-time signals using low-pass filters of an adequate bandwidth. This bandwidth may be determined in a given case by simulation to verify that desired system parameters such as modulation vector accuracy and adjacent channel energy suppression are met.

The present invention may also be extended to embodiments that use more than two coupled power amplifiers. For example, it is advantageous to use a first pair of amplifiers to generate a signal corresponding only to the real ("I") part of a desired complex modulation and a second pair of amplifiers to generate the "Q" part. The equivalent series combination of the four amplifiers into the load then generates the desired I+jQ complex modulation. This was disclosed in the CIP Application. In the CIP application, the four amplifiers amplified constant amplitude, purely phase-modulated signals, but embodiments of the present invention, in which varying amplitude vectors are combined, can alternatively be used as was described above.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of amplifying a signal of varying amplitude comprising:

amplifying the signal of varying amplitude in a first saturated power amplifier that operates from a fixed voltage power supply to produce a first output signal of constant amplitude;

amplifying the signal of varying amplitude in a second saturated power amplifier that operates from a modulated voltage power supply to produce a second output signal of amplitude that depends on the signal of varying amplitude, the modulated power supply voltage and on an invert/noninvert control signal;

combining the first and second output signals into a load; and modulating the modulated voltage power supply while generating the invert/noninvert control signal such that the combined first and second output signals into the load amplify the signal of varying amplitude.

2. The method according to claim 1 wherein the signal of varying amplitude is of varying amplitude and varying phase.

3. The method according to claim 1 wherein the modulating the modulated voltage power supply comprises modulating the modulated voltage power supply while generating the invert/noninvert control signal to invert the second output signal relative to the signal of varying amplitude when an instantaneous amplitude of the signal of varying amplitude is less than an amplitude that is produced in the load by the first saturated amplifier and to noninvert the second output signal relative to the signal of varying amplitude when the instantaneous amplitude of the signal is greater than the amplitude that is produced in the load by the first saturated amplifier, such that the combined first and second output signals into the load amplify the signal of varying amplitude.

4. The method according to claim 1 wherein the amplifying the signal using a second saturated power amplifier comprises amplifying the signal of varying amplitude using a second saturated power amplifier that operates from a modulated voltage power supply and that uses bilateral amplification devices that draw current from the modulated voltage power supply and that supply current to the modulated voltage power supply, to produce a second output signal of amplitude that depends on the signal of varying amplitude, the modulated power supply voltage and the invert/noninvert control signal.

5. The method according to claim 1 wherein the amplifying the signal in a first saturated power amplifier comprises amplifying the signal of varying amplitude in a first saturated power amplifier that operates from a fixed voltage power supply, that draws current from the fixed voltage power supply and that does not supply current to the fixed voltage power supply, to produce a first output signal of constant amplitude.

6. The method according to claim 1 wherein the combining the first and second output signals into a load comprises serially combining the first and second output signals with the load.

7. The method according to claim 6 wherein the serially combining the first and second output signals with the load comprises connecting one of the first and second output signals directly to the load and connecting the other of the first and second output signals to the load via an isolation transformer.

8. The method according to claim 6 wherein the serially combining the first and second output signals with the load comprises connecting the respective first and second output signals to the load via respective first and second quarter wave lines.

9. The method according to claim 1 wherein the amplifying the signal using a second saturated power amplifier comprises amplifying the signal of varying amplitude using a second saturated power amplifier that operates from a modulated voltage power supply and that draws current from the modulated voltage power supply when the invert/noninvert control signal indicates noninvert and that supplies current to the modulated voltage power supply when the invert/noninvert control signal indicates invert, to produce a second output signal of amplitude that depends on the signal of varying amplitude, the modulated power supply voltage and the invert/noninvert control signal.

10. The method according to claim 1:
wherein the signal of varying amplitude includes an in-phase component and a quadrature-phase component;
wherein the amplifying the signal of varying amplitude in a first saturated power amplifier comprises amplifying the in-phase component of the signal of varying amplitude in a first saturated power amplifier that operates from a first fixed voltage power supply to produce a first output signal of constant amplitude;
wherein the amplifying the signal of varying amplitude in a second saturated power amplifier comprises amplifying the in-phase component of the signal of varying amplitude in a second saturated power amplifier that operates from a first modulated voltage power supply to produce a second output signal of amplitude that depends on the in-phase component of the signal of varying amplitude, the first modulated power supply voltage and on a first invert/noninvert control signal;
the method further comprising:
amplifying the quadrature-phase component of the signal of varying amplitude in a third saturated power amplifier that operates from a second fixed voltage power supply to produce a third output signal of constant amplitude; and
amplifying the quadrature-phase component of the signal of varying amplitude in a fourth saturated power amplifier that operates from a second modulated voltage power supply to produce a fourth output signal of amplitude that depends on the quadrature-phase component of the signal of varying amplitude, the second modulated power supply voltage and on a second invert/noninvert control signal;
wherein the combining comprises combining the first, second, third and fourth output signals into a load; and
wherein the modulating comprises modulating the first and second modulated voltage power supplies while generating the first and second invert/noninvert control signals such that the combined first, second, third and fourth output signals into the load amplify the signal of varying amplitude.

11. A system for amplifying a signal of varying amplitude, comprising:
a fixed voltage power supply;
a modulated voltage power supply;
a first saturated power amplifier that is responsive to the signal of varying amplitude and that is powered by the fixed voltage power supply to produce a first output signal of constant amplitude;
a second saturated power amplifier that is responsive to the signal of varying amplitude and to an invert/noninvert control signal and that is powered by the modulated voltage power supply to produce a second output signal of amplitude that depends on the signal of varying amplitude, the modulated power supply voltage and on the invert/noninvert control signal;
a coupler that couples the first and second output signals to a load; and
a controller that modulates the modulated voltage power supply while generating the invert/noninvert control signal.

12. The system according to claim 11 wherein the signal of varying amplitude is of varying amplitude and varying phase.

13. The system according to claim 11 wherein the controller modulates the modulated voltage power supply while generating the invert/noninvert control signal to invert the second output signal relative to the signal of varying amplitude when an instantaneous amplitude of the signal of varying amplitude is less than an amplitude that is produced in the load by the first saturated amplifier and to noninvert the second output signal relative to the signal of varying amplitude when the instantaneous amplitude of the signal is greater than the amplitude that is produced in the load by the first saturated amplifier.

14. The system according to claim 11 wherein the second saturated power amplifier comprises bilateral amplification devices that draw current from the modulated voltage power supply and that supply current to the modulated voltage power supply.

15. The system according to claim 11 wherein the first saturated power amplifier draws current from the fixed voltage power supply and does not supply current to the fixed voltage power supply.

16. The system according to claim 11 wherein the coupler serially couples the first and second output signals with the load.

17. The system according to claim 11 wherein the coupler comprises a direct connection of one of the first and second output signals to the load and an isolation transformer that connects the other of the first and second output signals to the load.

18. The system according to claim 11 wherein the coupler comprises a first quarter wavelength line that connects the first output signal to the load and a second quarter wave line that connects the second output signal to the load.

19. The system according to claim 11 wherein the modulated voltage power supply comprises a bidirectional Direct Current (DC) power conversion circuit that transfers DC power in a forward direction from a first terminal at a first voltage to a second terminal at a second voltage, wherein the first voltage is higher than the second voltage, relative to a common voltage at a common terminal and in a reverse direction from the second terminal at the second voltage to the first terminal at the first voltage, the bidirectional DC power conversion circuit comprising:

an inductor having first and second inductor ends;

a first switch that is connected between the first terminal and the first inductor end to define a node therebetween;

a second switch that is connected between the node and the common terminal;

the second inductor end being connected to the second terminal; and a switch controller that simultaneously closes the first switch and opens the second switch, that simultaneously opens the first switch and closes the second switch and that maintains the first switch closed and the second switch open for a percentage of time that approximates a ratio of the second voltage to the first voltage.

20. The system according to claim 11:

wherein the signal of varying amplitude includes an in-phase component and a quadrature-phase component;

wherein the first saturated power amplifier is responsive to the in-phase component of the signal of varying amplitude and is powered by the fixed voltage power supply to produce the first output signal of constant amplitude;

wherein the second saturated power amplifier is responsive to the in-phase component of the signal of varying amplitude and to the invert/noninvert control signal and is powered by the modulated voltage power supply to produce the second output signal of amplitude that depends on the signal of varying amplitude, the modulated power supply voltage and on the invert/noninvert control signal;

the system further comprising:

a third saturated power amplifier that is responsive to the quadrature-phase component of the signal of varying amplitude and that is powered by a second fixed voltage power supply to produce a third output signal of constant amplitude; and a fourth saturated power amplifier that is responsive to the quadrature-phase component of the signal of varying amplitude and that is powered by a second modulated voltage power supply to produce a fourth output signal of amplitude that depends on the quadrature-phase component of the signal of varying amplitude, the second modulated power supply voltage and on a second invert/noninvert control signal;

wherein the coupler couples the first, second, third and fourth output signals into a load; and wherein the controller modulates the first and second modulated voltage power supplies while generating the first and second invert/noninvert control signals such that the combined first, second, third and fourth output signals into the load amplify the signal of varying amplitude.

21. A system for amplifying a signal of varying amplitude, comprising:

first means for amplifying the signal of varying amplitude from a fixed voltage power supply to produce a first output signal of constant amplitude;

second means for amplifying the signal of varying amplitude from a modulated voltage power supply to produce a second output signal of amplitude that depends on the signal of varying amplitude, the modulated power supply voltage and on an invert/noninvert control signal;

means for combining the first and second output signals into a load; and means for modulating the modulated voltage power supply while generating the invert/noninvert control signal such that the combined first and second output signals into the load amplify the signal of varying amplitude.

22. The system according to claim 21 wherein the signal of varying amplitude is of varying amplitude and varying phase.

23. The system according to claim 21 wherein the means for modulating comprises means for modulating the modulated voltage power supply while generating the invert/ noninvert control signal to invert the second output signal relative to the signal of varying amplitude when an instantaneous amplitude of the signal of varying amplitude is less than an amplitude that is produced in the load by the first saturated amplifier and to noninvert the second output signal relative to the signal of varying amplitude when the instantaneous amplitude of the signal is greater than the amplitude that is produced in the load by the first saturated amplifier, such that the combined first and second output signals into the load amplify the signal of varying amplitude.

24. The system according to claim 21 wherein the second means for amplifying comprises second means for amplifying the signal of varying amplitude from a modulated voltage power supply and that uses bilateral amplification devices that draw current from the modulated voltage power supply and that supply current to the modulated voltage power supply, to produce a second output signal of amplitude that depends on the signal of varying amplitude, the modulated power supply voltage and the invert/noninvert control signal.

25. The system according to claim 21 wherein the first means for amplifying comprises first means for amplifying the signal of varying amplitude in a first saturated power amplifier that operates from a fixed voltage power supply, that draws current from the fixed voltage power supply and that does not supply current to the fixed voltage power supply, to produce a first output signal of constant amplitude.

26. The system according to claim 21 wherein the means for combining comprises means for serially combining the first and second output signals with the load.

27. The system according to claim 26 wherein the means for serially combining comprises means for connecting one of the first and second output signals directly to the load and means for connecting the other of the first and second output signals to the load via an isolation transformer.

28. The system according to claim 26 wherein the means for serially combining comprises means for connecting the respective first and second output signals to the load via respective first and second quarter wave lines.

29. The system according to claim 21 wherein the second means for amplifying comprises second means for amplifying the signal of varying amplitude using a second saturated power amplifier that operates from a modulated voltage power supply and that draws current from the modulated voltage power supply when the invert/noninvert control signal indicates noninvert and that supplies current to the modulated voltage power supply when the invert/noninvert control signal indicates invert, to produce a second output signal of amplitude that depends on the signal of varying amplitude, the modulated power supply voltage and on an invert/noninvert control signal.

30. The system according to claim 21:
wherein the signal of varying amplitude includes an in-phase component and a quadrature-phase component;
wherein the first means for amplifying comprises first means for amplifying the in-phase component of the signal of varying amplitude from a first fixed voltage power supply to produce a first output signal of constant amplitude;
wherein the second means for amplifying comprises second means for amplifying the in-phase component of the signal of varying amplitude from a first modulated voltage power supply to produce a second output signal of amplitude that depends on the in-phase component of the signal of varying amplitude, the first modulated power supply voltage and on a first invert/noninvert control signal;
the system further comprising:
third means for amplifying the quadrature-phase component of the signal of varying amplitude from a second fixed voltage power supply to produce a third output signal of constant amplitude; and
fourth means for amplifying the quadrature-phase component of the signal of varying amplitude from a second modulated voltage power supply to produce a fourth output signal of amplitude that depends on the quadrature-phase component of the signal of varying amplitude, the second modulated power supply voltage and on a second invert/noninvert control signal;
wherein the means for combining comprises means for combining the first, second, third and fourth output signals into a load; and
wherein the means for modulating comprises means for modulating the first and second modulated voltage power supplies while generating the first and second invert/noninvert control signals such that the combined first, second, third and fourth output signals into the load amplify the signal of varying amplitude.

31. A method of amplifying a signal, comprising:
generating a first input signal, a second input signal, an invert/noninvert control signal and a variable power supply voltage from the signal;
amplifying the first input signal using a fixed power supply voltage, to produce a first output signal;
selectively invertingly and noninvertingly amplifying the second input signal using the variable power supply voltage in response to the invert/noninvert control signal, to produce a second output signal; and
coupling the first and second output signals into a load to thereby amplify the signal.

32. The method according to claim 31 wherein the selectively invertingly and noninvertingly amplifying the second input signal comprises selectively drawing current from the modulated voltage power supply and selectively supplying current to the modulated voltage power supply.

33. The method according to claim 32 wherein the amplifying the first input signal comprises amplifying the first input signal using a fixed power supply voltage by drawing current from the fixed power supply voltage without supplying current to the fixed power supply voltage.

34. The method according to claim 31 wherein the coupling comprises coupling one of the first and second output signals directly to the load and coupling the other of the first and second output signals to the load via an isolation transformer.

35. The method according to claim 31 wherein the coupling comprises coupling the respective first and second output signals to the load via respective first and second quarter wave lines.

36. The method according to claim 31:
wherein the signal includes an in-phase component and a quadrature-phase component;
wherein the generating comprises generating a first in-phase input signal, a second in-phase input signal, a third quadrature-phase input signal and a fourth quadrature-phase input signal, a first invert/noninvert control signal, a second invert/noninvert control signal, a first variable power supply voltage and a second variable power supply voltage from the in-phase component and the quadrature-phase component;
wherein the amplifying the first input signal comprises amplifying the first in-phase input signal using a first fixed power supply voltage, to produce the first output signal;
wherein the selectively invertingly and noninvertingly amplifying the second input signal comprises selectively invertingly and noninvertingly amplifying the second in-phase input signal using the first variable power supply voltage in response to the first invert/noninvert control signal, to produce the second output signal;
the method further comprising:
amplifying the third quadrature-phase input signal using a second fixed power supply voltage, to produce a third output signal; and
selectively invertingly and noninvertingly amplifying the fourth quadrature-phase input signal using the second variable power supply voltage in response to the second invert/noninvert control signal, to produce a fourth output signal; and
wherein the coupling step comprises coupling the first, second, third and fourth output signals into a load to thereby amplify the signal.

37. A system for amplifying a signal, comprising:
means for generating a first input signal, a second input signal, an invert/noninvert control signal and a variable power supply voltage from the signal;
means for amplifying the first input signal using a fixed power supply voltage, to produce a first output signal;
means for selectively invertingly and noninvertingly amplifying the second input signal using the variable power supply voltage in response to the invert/noninvert control signal, to produce a second output signal; and
means for coupling the first and second output signals into a load to thereby amplify the signal.

38. The system according to claim 37 wherein the means for selectively invertingly and noninvertingly amplifying the second input signal comprises means for selectively drawing current from the variable power supply voltage and for selectively supplying current to the variable power supply voltage.

39. The system according to claim 38 wherein the means for amplifying comprises means for amplifying the first input signal using a fixed power supply voltage by drawing current from the fixed power supply voltage without supplying current to the fixed power supply voltage.

40. The system according to claim 37 wherein the means for coupling comprises means for coupling one of the first and second output signals directly to the load and means for coupling the other of the first and second output signals to the load via an isolation transformer.

41. The system according to claim 37 wherein the means for coupling comprises means for coupling the respective first and second output signals to the load via respective first and second quarter wave lines.

42. The system according to claim 37:
wherein the signal includes an in-phase component and a quadrature-phase component;
wherein the means for generating comprises means for generating a first in-phase input signal, a second in-phase input signal, a third quadrature-phase input signal and a fourth quadrature-phase input signal, a first invert/noninvert control signal, a second invert/noninvert control signal, a first variable power supply voltage and a second variable power supply voltage from the in-phase component and the quadrature-phase component;
wherein the means for amplifying the first input signal comprises means for amplifying the first in-phase input signal using a first fixed power supply voltage, to produce the first output signal;
wherein the means for selectively invertingly and noninvertingly amplifying the second input signal comprises means for selectively invertingly and noninvertingly amplifying the second in-phase input signal using the first variable power supply voltage in response to the first invert/noninvert control signal, to produce the second output signal; the system further comprising:
means for amplifying the third quadrature-phase input signal using a second fixed power supply voltage, to produce a third output signal; and
means for selectively invertingly and noninvertingly amplifying the fourth quadrature-phase input signal using the second variable power supply voltage in response to the second invert/noninvert control signal, to produce a fourth output signal; and
wherein the means for coupling comprises means for coupling the first, second, third and fourth output signals into a load to thereby amplify the signal.

43. A system for amplifying a signal, comprising:
a signal generator that generates a first input signal, a second input signal, an invert/noninvert control signal and a variable power supply voltage from the signal;
a first power amplifier that amplifies the first input signal using a fixed power supply voltage, to produce a first output signal;
a second power amplifier that selectively invertingly and noninvertingly amplifies the second input signal using the variable power supply voltage in response to the invert/noninvert control signal, to produce a second output signal; and
a coupler that couples the first and second output signals into a load to thereby amplify the signal.

44. The system according to claim 43 wherein the second power amplifier selectively draws current from the modulated voltage power supply and selectively supplies current to the modulated voltage power supply.

45. The system according to claim 44 wherein the first power amplifier draws current from the fixed power supply voltage but does not supply current to the fixed power supply voltage.

46. The system according to claim 43 wherein the coupler comprises a direct connector of one of the first and second output signals to the load and an isolation transformer that connects the other of the first and second output signals to the load.

47. The system according to claim 43 wherein the coupler comprises a first quarter wave line that couples the first output signal to the load and a second quarter wave line that couples the second output signal to the load.

48. The system according to claim 43:
wherein the signal includes an in-phase component and a quadrature-phase component;
wherein the signal generator generates a first in-phase input signal, a second in-phase input signal, a third quadrature-phase input signal and a fourth quadrature-phase input signal, a first invert/noninvert control signal, a second invert/noninvert control signal, a first variable power supply voltage and a second variable power supply voltage from the in-phase component and the quadrature-phase component;
wherein the first power amplifier amplifies the first in-phase input signal using a first fixed power supply voltage, to produce the first output signal;
wherein the second power amplifier selectively invertingly and noninvertingly amplifies the second in-phase input signal using the first variable power supply voltage in response to the first invert/noninvert control signal, to produce the second output signal;
the system further comprising:
a third power amplifier that amplifies the third quadrature-phase input signal using a second fixed power supply voltage, to produce a third output signal; and
a fourth power amplifier that selectively invertingly and noninvertingly amplifies the fourth quadrature-phase input signal using the second variable power supply voltage in response to the second invert/noninvert control signal, to produce a fourth output signal; and
wherein the coupler couples the first, second, third and fourth output signals into a load to thereby amplify the signal.

49. The system according to claim 43 wherein the signal generator comprises a bidirectional Direct Current (DC)

power conversion circuit that transfers DC power in a forward direction from a first terminal at a first voltage to a second terminal at a second voltage, wherein the first voltage is higher than the second voltage relative to a common voltage at a common terminal, and in a reverse direction from the second terminal at the second voltage to the first terminal at the first voltage, the bidirectional DC power conversion circuit comprising:

an inductor having first and second inductor ends;

a first switch that is connected between the first terminal and the first inductor end to define a node therebetween;

a second switch that is connected between the node and the common terminal;

the second inductor end being connected to the second terminal; and a switch controller that simultaneously closes the first switch and opens the second switch, that simultaneously opens the first switch and closes the second switch and that maintains the first switch closed and the second switch open for a percentage of time that approximates a ratio of the second voltage to the first voltage.

50. A method of amplifying a signal, comprising:

generating first and second input signals and first and second variable power supply voltages from the signal;

amplifing the first input signal using the first variable power supply voltage, to produce a first output signal;

amplifying the second input signal using the second variable power supply voltage, to produce a second output signal; and coupling the first and second output signals into a load to thereby amplify the signal.

51. The method according to claim 50 wherein the coupling comprises coupling one of the first and second output signals directly to the load and coupling the other of the first and second output signals to the load via an isolation transformer.

52. The method according to claim 50 wherein the coupling comprises coupling the respective first and second output signals to the load via respective first and second quarter wave lines.

53. A system for amplifying a signal, comprising:

means for generating first and second input signals and first and second variable power supply voltages from the signal;

first means for amplifying the first input signal using the first variable power supply voltage, to produce a first output signal;

second means for amplifying the second input signal using the second variable power supply voltage, to produce a second output signal; and means for coupling the first and second output signals into a load to thereby amplify the signal.

54. The system according to claim 53 wherein the means for coupling comprises means for coupling one of the first and second output signals directly to the load and means for coupling the other of the first and second output signals to the load via an isolation transformer.

55. The system according to claim 53 wherein the means for coupling comprises means for coupling the respective first and second output signals to the load via respective first and second quarter wave lines.

56. A system for amplifying a signal, comprising:

a signal generator that generates first and second input signals and first and second variable power supply voltages from the signal;

a first power amplifier that amplifies the first input signal using the first variable power supply voltage, to produce a first output signal;

a second power amplifier that selectively amplifies the second input signal using the second variable power supply voltage, to produce a second output signal; and a coupler that couples the first and second output signals into a load to thereby amplify the signal.

57. The system according to claim 56 wherein the coupler comprises a direct connector of one of the first and second output signals to the load and an isolation transformer that connects the other of the first and second output signals to the load.

58. The system according to claim 56 wherein the coupler comprises a first quarter wave line that couples the first output signal to the load and a second quarter wave line that couples the second output signal to the load.

* * * * *